(12) United States Patent
Yamazawa

(10) Patent No.: US 9,218,943 B2
(45) Date of Patent: Dec. 22, 2015

(54) PLASMA PROCESSING APPARATUS AND PLASMA PROCESSING METHOD

(75) Inventor: Yohei Yamazawa, Nirasaki (JP)

(73) Assignee: TOYKO ELECTRON LIMITED, Tokyo (JP)

( * ) Notice: Subject to any disclaimer, the term of this patent is extended or adjusted under 35 U.S.C. 154(b) by 1018 days.

(21) Appl. No.: 13/246,139

(22) Filed: Sep. 27, 2011

(65) Prior Publication Data
US 2012/0074100 A1    Mar. 29, 2012

Related U.S. Application Data

(60) Provisional application No. 61/391,946, filed on Oct. 11, 2010.

(30) Foreign Application Priority Data

Sep. 28, 2010    (JP) ................................. 2010-217271

(51) Int. Cl.
| | |
|---|---|
| *C23C 16/00* | (2006.01) |
| *C23F 1/00* | (2006.01) |
| *H01L 21/306* | (2006.01) |
| *H01J 37/32* | (2006.01) |

(52) U.S. Cl.
CPC ............ *H01J 37/321* (2013.01); *H01J 37/3211* (2013.01); *H01J 37/32174* (2013.01)

(58) Field of Classification Search
CPC ................ H01J 37/321; H01J 37/3211; H01J 37/32174; H05H 2001/4652; H05H 2001/466; H05H 2001/467

USPC ........ 156/345.48, 345.49; 118/723 I, 723 IR; 315/111.51

See application file for complete search history.

(56) References Cited

U.S. PATENT DOCUMENTS

| | | | | |
|---|---|---|---|---|
| 5,521,351 | A | * | 5/1996 | Mahoney ................. 219/121.59 |
| 5,846,883 | A | * | 12/1998 | Moslehi ........................ 438/711 |
| 6,072,147 | A | * | 6/2000 | Koshiishi et al. ........ 219/121.43 |
| 6,164,241 | A | | 12/2000 | Chen et al. |
| 6,252,354 | B1 | * | 6/2001 | Collins et al. ............ 315/111.51 |
| 6,288,493 | B1 | | 9/2001 | Lee et al. |
| 7,096,819 | B2 | | 8/2006 | Chen et al. |

(Continued)

FOREIGN PATENT DOCUMENTS

| | | |
|---|---|---|
| CN | 1520245 A | 8/2004 |
| CN | 1833296 A | 9/2006 |

(Continued)

*Primary Examiner* — Rakesh Dhingra
(74) *Attorney, Agent, or Firm* — Pearne & Gordon LLP

(57) ABSTRACT

There is provided an inductively coupled plasma processing apparatus capable of reducing a RF power loss within a high frequency power supply unit (particularly, a matching unit) and capable of enhancing a plasma generation efficiency. In this inductively coupled plasma processing apparatus, a multiple number of closed-loop secondary circuits 96, 98 independent from each other are formed between a coaxial antenna group 54 and a transformer 68. Further, by varying electrostatic capacitances of variable capacitors 64 and 66, secondary currents $I_{2A}$ and $I_{2B}$ flowing through an inner antenna 58 and an outer antenna 60, respectively, of the coaxial antenna group 54 are independently controlled. Accordingly, it is possible to readily control a plasma density distribution on a semiconductor wafer W in a diametrical direction.

15 Claims, 18 Drawing Sheets

(56) References Cited

U.S. PATENT DOCUMENTS

| | | | |
|---|---|---|---|
| 2001/0054383 A1* | 12/2001 | Pu et al. | 118/723.001 |
| 2004/0124779 A1 | 7/2004 | Howald et al. | |
| 2008/0156264 A1* | 7/2008 | Fair et al. | 118/723 E |
| 2010/0194281 A1* | 8/2010 | Carter et al. | 315/111.71 |

FOREIGN PATENT DOCUMENTS

| | | |
|---|---|---|
| JP | 09-106979 A | 4/1997 |
| JP | 10-064697 A | 3/1998 |
| JP | 2000-515304 A | 11/2000 |
| JP | 2002-508883 A | 3/2002 |
| JP | 2004-031566 A | 1/2004 |
| JP | 2006-318725 A | 11/2006 |
| JP | 2007-514300 A | 5/2007 |
| JP | 2009-506496 A | 2/2009 |
| JP | 2009-076798 A | 4/2009 |
| JP | 2010-135298 A | 6/2010 |
| TW | 447226 | 7/2001 |
| WO | 98/01893 A1 | 1/1998 |
| WO | 99/01887 A1 | 1/1999 |
| WO | 2004/077608 A2 | 9/2004 |
| WO | 2005/048301 A2 | 5/2005 |
| WO | 2007/024134 A1 | 3/2007 |

* cited by examiner (CURRENT DENSITY DISTRIBUTION
WITHIN DONUT-SHAPED PLASMA)

PLASMA PROCESSING APPARATUS AND PLASMA PROCESSING METHOD

CROSS-REFERENCE TO RELATED APPLICATION

This application claims the benefit of Japanese Patent Application No. 2010-217271 filed on Sep. 28, 2010, and U.S. Provisional Application Ser. No. 61/391,946 filed on Oct. 11, 2010, the entire disclosures of which are incorporated herein by reference.

FIELD OF THE INVENTION

The present disclosure relates to a technique for performing a plasma process on a target substrate, and more particularly, to an inductively coupled plasma processing apparatus and an inductively coupled plasma processing method.

BACKGROUND OF THE INVENTION

In a manufacturing process of a semiconductor device or a FPD (Flat Panel Display), plasma is used to perform a process, such as etching, deposition, oxidation or sputtering, so as to perform a good reaction of a processing gas at a relatively low temperature. Conventionally, plasma generated by a high frequency electric discharge in MHz frequency band has been used in this kind of plasma process. The plasma generated by the high frequency electric discharge is largely divided into capacitively coupled plasma and inductively coupled plasma according to a plasma generation method (in view of an apparatus).

Generally, in an inductively coupled plasma processing apparatus, at least a part (for example, a ceiling) of walls of a processing chamber may have a dielectric window, and a high frequency power is supplied to a coil-shaped RF antenna positioned at an outside of this dielectric window. The processing chamber serves as a depressurizable vacuum chamber, and a target substrate (for example, a semiconductor wafer and a glass substrate) is provided at a central region within the chamber. A processing gas is supplied into a processing space formed between the dielectric window and the substrate. A RF magnetic field is generated around a RF antenna by a RF current flowing through the RF antenna. Magnetic force lines of the RF magnetic field penetrate the dielectric window, and pass through the processing space within the chamber. As the RF magnetic field changes with time, an inductive electric field is generated in an azimuth direction within the processing space. Then, electrons accelerated by this inductive electromagnetic field in the azimuth direction collide with molecules or atoms of the processing gas so as to be ionized. In this process, a donut-shaped plasma may be generated.

Since a large processing space is formed within the chamber, the donut-shaped plasma can be diffused efficiently in all directions (particularly, in a radial direction) and a plasma density on the substrate becomes very uniform. However, only with a conventional RF antenna, the plasma density on a substrate is not sufficiently uniform for most plasma processes. As for an inductively coupled plasma processing apparatus, it is also one of the most important issues to improve uniformity of a plasma density on a substrate since a uniformity/reproducibility and a production yield of a plasma process depend on the plasma uniformity. Until now, there have been suggested several techniques related to this problem.

As a representative technique for controlling (particularly, uniformizing) a plasma density distribution on a target substrate in a diametric direction in an inductively coupled plasma processing apparatus, a following method has been well known. That is, a RF antenna is divided into multiple coil-shaped antenna segments and an impedance of each antenna segment is varied by an impedance control circuit. Therefore, a split ratio of a RF power distributed to each of all antenna segments from a single high frequency power supply is controlled (for example, Patent Documents 1, 2 and 3).

Generally, this kind of impedance control circuit includes a variable capacitor and is connected in series to each of multiple antenna segments. Further, the impedance control circuits are connected in parallel between an output terminal of a matching unit and a ground potential terminal.

Typically, a matching unit used in the inductively coupled plasma processing apparatus includes an automatic matching device that variably controls a load impedance viewed from the high frequency power supply depending on a variation of a plasma load. If an impedance of the plasma load is varied due to a variation of a pressure during a plasma process, this kind of automatic matching device is configured to vary a reactance of a variable reactance element (generally, a variable capacitor) in a matching circuit. Further, this automatic matching device is configured to automatically control a load impedance to set the load impedance to be a matching point (typically, 50Ω). For this automatic matching function, the automatic matching device includes a circuit that measures a power of a reflection wave or a controller that variably controls a reactance of each variable reactance element by a stepping motor such that a measurement value of the load impedance is matched to the matching point (50Ω).

Patent Document 1: U.S. Pat. No. 6,164,241
Patent Document 2: U.S. Pat. No. 6,288,493
Patent Document 3: U.S. Pat. No. 7,096,819

However, in the above-described conventional RF antenna division method, since the RF current is split to flow through each of the multiple antenna segments, a pre-divided RF current flowing through a high frequency power supply unit is remarkably greater than the RF current flowing through each antenna segment. Therefore, there is a great loss of a RF power within the high frequency power supply unit (particularly, the matching unit), and the RF power to be supplied to the plasma load is decreased as much as the loss. As a result, a plasma generation efficiency is decreased.

BRIEF SUMMARY OF THE INVENTION

In view of the foregoing, the present disclosure provides an inductively coupled plasma processing apparatus and a plasma processing method capable of reducing a RF power loss within a high frequency power supply unit (particularly, a matching unit) and enhancing a plasma generation efficiency.

Further, the present disclosure provides an inductively coupled plasma processing apparatus capable of enhancing a plasma generation efficiency as described above and simplifying a matching unit.

In accordance with one aspect of the present disclosure, there is provided a plasma processing apparatus including: a processing chamber including a dielectric window; a substrate holder capable of holding a target substrate within the processing chamber; a processing gas supply unit that supplies a processing gas into the processing chamber to perform a plasma process on the substrate; multiple antennas provided outside the dielectric window to generate plasma of the processing gas by an induced coupling within the processing chamber; a high frequency power supply unit that supplies to the multiple antennas a high frequency power having a frequency for generating a high frequency electric discharge of the processing gas; a primary coil connected to a terminal of the high frequency power supply unit; multiple secondary coils, each being coupled with the primary coil by electromagnetic induction and electrically connected to the corresponding antenna, thereby forming closed-loop secondary circuits; and multiple capacitors, each being provided in each of the secondary circuits.

In accordance with another aspect of the present disclosure, there is provided a plasma processing method for performing a plasma process on a substrate in a plasma processing apparatus including: a processing chamber including a dielectric window; a substrate holder that capable of holding a target substrate within the processing chamber; a processing gas supply unit that supplies a processing gas into the processing chamber to perform a plasma process on the substrate; multiple antennas provided outside the dielectric window to generate plasma of the processing gas by an induced coupling within the processing chamber; a high frequency power supply unit that supplies to the multiple antennas a high frequency power having a frequency for generating a high frequency electric discharge of the processing gas; a primary coil connected to a terminal of the high frequency power supply unit; multiple secondary coils, each being coupled with the primary coil by electromagnetic induction and electrically connected to the corresponding antenna, thereby forming closed-loop secondary circuits; and multiple capacitors, each being provided in each of the secondary circuits. The plasma processing method may include controlling a plasma density distribution by selecting or variably controlling electrostatic capacitances of the capacitors.

In the plasma processing apparatus or the plasma processing method of the present disclosure, a high frequency power may be supplied from a high frequency power supply unit to an antenna during a process. At this time, a primary current of the high frequency may flow through a primary coil of the high frequency power supply unit, and magnetic force lines (magnetic flux) generated around the primary coil by the primary current may be interlinked with each secondary coil. As the magnetic flux changes with time, an induced electromotive power may be generated at each secondary coil by electromagnetic induction, and secondary currents (induced currents) of the high frequency may flow through secondary circuits.

As described above, each secondary current may flow through each antenna within each secondary circuit. As a result, inductively coupled plasma may be generated at a plasma generation space corresponding to each antenna by an electronic energy radiated from each antenna to a processing gas within a processing chamber via a dielectric window. Thus, the plasma generated at the plasma generation space within the processing chamber may be diffused in all directions, so that in a vicinity of a substrate holder, i.e. on a substrate, a plasma density may become uniformized. At this time, by setting or variably controlling an electrostatic capacitance of a capacitor provided in each secondary circuit to be an appropriate value, it is possible to control balance between the secondary currents flowing through the multiple antennas. Accordingly, it is possible to readily control a plasma density distribution on the substrate.

Further, in the high frequency power supply unit, the multiple antennas may be electrically connected to the primary coil via respective secondary coils. Therefore, an apparent load resistance of the primary coil may be increased. Thus, the primary current may be decreased and a RF power loss in the high frequency power supply unit can be reduced. Accordingly, a RF power to be supplied to a plasma load becomes increased, and a plasma generation efficiency becomes enhanced.

In accordance with a plasma processing apparatus or a plasma processing method of the present disclosure, with the above-described configuration and operation, it is possible to enhance a plasma generation efficiency by reducing a power loss within a high frequency power supply unit (particularly, a matching unit), and also possible to simplify the matching unit.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, embodiments of the present disclosure will be described in detail with reference to the accompanying drawings.

[Configuration and Operation of Whole Apparatus]

Figure 1:
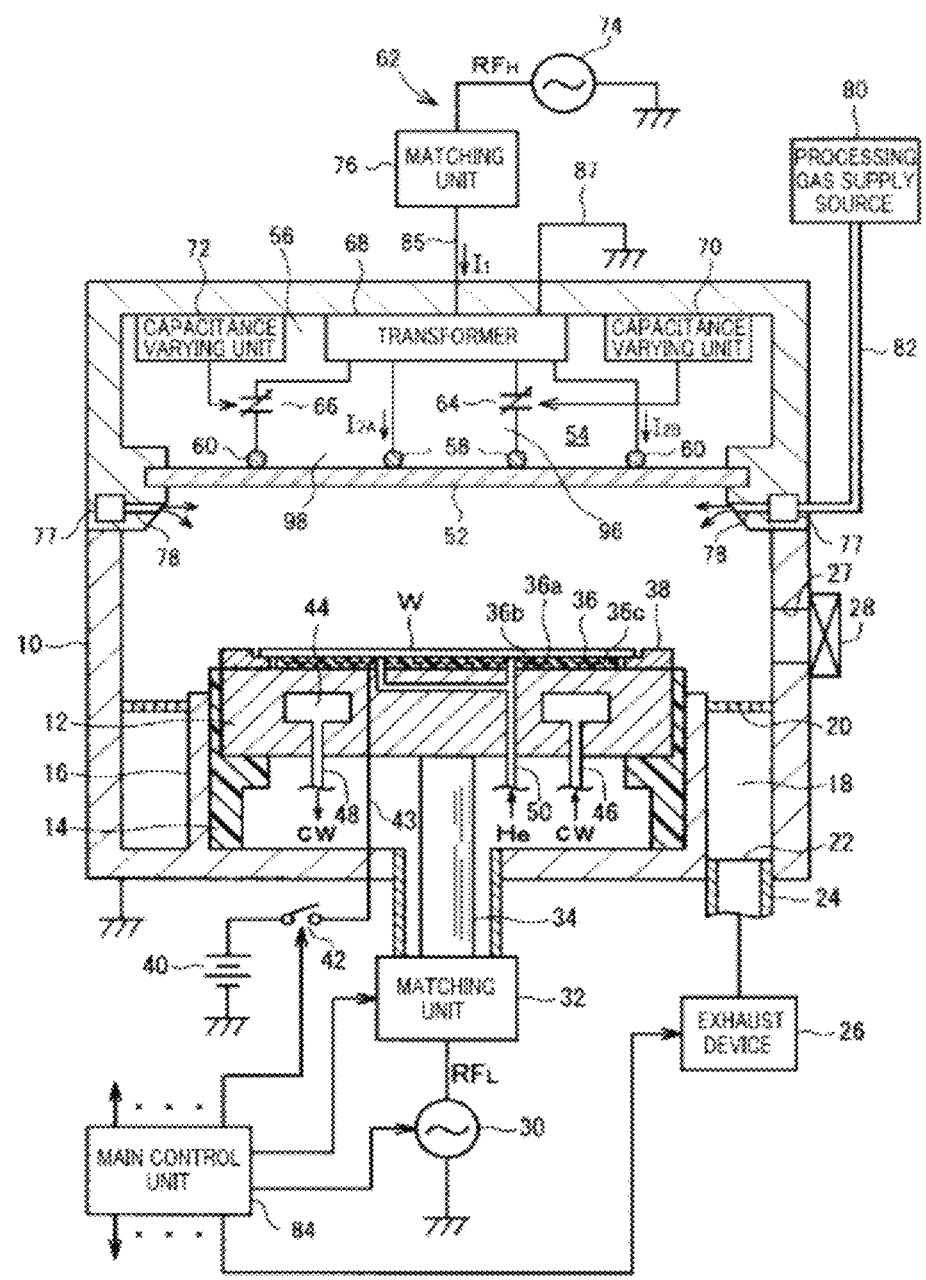
FIG. 1 is a longitudinal cross sectional view showing a configuration of an inductively coupled plasma processing apparatus in accordance with an embodiment of the present disclosure.

FIG. 1 shows a configuration of an inductively coupled plasma processing apparatus in accordance with a first embodiment. This inductively coupled plasma processing apparatus may be configured as a plasma etching apparatus using a planar coil RF antenna and may include a cylindrical vacuum chamber (processing chamber) 10 made of metal such as aluminum or stainless steel. The chamber 10 may be frame grounded.

Above all, there will be explained a configuration of each component which is not related to plasma generation in this inductively coupled plasma processing apparatus.

At a lower central region within the chamber 10, a circular plate-shaped susceptor 12 may be provided horizontally. The susceptor 12 may mount thereon a target substrate such as a semiconductor wafer W and may serve as a high frequency electrode as well as a substrate holder. This susceptor 12 may be made of, for example, aluminum and may be supported by a cylindrical insulating support 14 which may be extended uprightly from a bottom of the chamber 10.

Between a cylindrical conductive support 16 which is extended uprightly from a bottom of the chamber 10 along the periphery of the cylindrical insulating support 14 and an inner wall of the chamber 10, an annular exhaust line 18 may be provided. Further, an annular baffle plate 20 may be provided at an upper portion or an inlet of the exhaust line 18. Further, an exhaust port 22 may be provided at a bottom portion. In order for a gas flow within the chamber 10 to be uniformized with respect to an axis of the semiconductor wafer W on the susceptor 12, multiple exhaust ports 22 equi-spaced from each other along a circumference may be provided.

Each exhaust port 22 may be connected to an exhaust device 26 via an exhaust pipe 24. The exhaust device 26 may include a vacuum pump such as a turbo molecular pump or the like. Thus it may be possible to depressurize a plasma generation space within the chamber 10 to a required vacuum level. At an outside of a sidewall of the chamber 10, a gate valve 28 configured to open and close a loading/unloading port 27 of the semiconductor wafer W may be provided.

The susceptor 12 may be electrically connected to a high frequency power supply 30 for RF bias via a matching unit 32 and a power supply rod 34. This high frequency power supply 30 may be configured to output a variable high frequency power $RF_L$ having an appropriate frequency (about 13.56 MHz or less) to control energies of ions attracted into the semiconductor wafer W. The matching unit 32 may accommodate a variable reactance matching circuit for performing matching between an impedance of the high frequency power supply 30 and an impedance of a load (mainly, susceptor, plasma and chamber). The matching circuit may include a blocking capacitor configured to generate a self-bias.

An electrostatic chuck 36 for holding the semiconductor wafer W by an electrostatic attraction force may be provided on an upper surface of the susceptor 12. Further, a focus ring 38 may be provided around the electrostatic chuck 36 to annularly surround the periphery of the semiconductor wafer W. The electrostatic chuck 36 may be formed by placing an electrode 36a made of a conductive film between a pair of insulating films 36b and 36c. A high voltage DC power supply 40 may be electrically connected to the electrode 36a via a switch 42 and a coated line 43. By applying a high DC voltage from the DC power supply 40, the semiconductor wafer W can be attracted to and held on the electrostatic chuck 36 by the electrostatic force.

An annular coolant cavity or a coolant path 44 of, e.g., a circular ring-shape, may be formed within the susceptor 12. A coolant, such as cooling water cw, having a certain temperature may be supplied into and circulated through the coolant path 44 from a chiller unit (not illustrated) via lines 46 and 48. By adjusting the temperature of the coolant, it may be possible to control a process temperature of the semiconductor wafer W held on the electrostatic chuck 36. Further, a heat transfer gas, such as a He gas, may be supplied from a heat transfer gas supply unit (not illustrated) into a space between an upper surface of the electrostatic chuck 36 and a rear surface of the semiconductor wafer W through a gas supply line 50. Furthermore, an elevating mechanism (not shown) including lift pins configured to move up and down vertically through the susceptor 12 may be provided to load and unload the semiconductor wafer W.

Hereinafter, there will be explained a configuration of each component which is related to plasma generation in this inductively coupled plasma processing apparatus.

A ceiling or a ceiling plate of the chamber 10 may be separated relatively far from the susceptor 12. A circular dielectric window 52 formed of, for example, a quartz plate may be airtightly provided as the ceiling plate. Above the dielectric window 52, an antenna chamber 56 may be provided as a part of the chamber 10. The antenna chamber 56 may be configured to accommodate therein a multiple number of or a group of antennas 54 and shield these antennas 54 from the outside. Here, the antennas 54 may generate inductively coupled plasma within the chamber 10.

In the present embodiment, the antenna group 54 may be in parallel with the dielectric window 52, and may include a plane inner antenna 58 and a plane outer antenna 60 positioned in a diametric direction with a certain gap therebetween. In the present embodiment, the inner antenna 58 and the outer antenna 60 may have an annular coil shape and may be positioned concentrically with each other as well as with the chamber 10 or the susceptor 12.

In the present disclosure, the term "coaxial" means that central axes of multiple objects having axisymmetric shape are aligned with each other. As for multiple plane antennas, respective planes on which multiple antennas are disposed may be offset with each other in an axial direction or may be aligned on the same plane (positioned concentrically).

The inner antenna 58 and the outer antenna 60 may be electrically connected in parallel with a high frequency power supply unit 62 for plasma generation via a transformer and variable capacitors 64 and 66, respectively. Desirably, an electrostatic capacitance of the variable capacitors 64 and 66 may be varied in a certain range by capacitance varying units 70 and 72 under the control of a main control unit 84. A configuration and operation of the transformer 68 will be explained in detail later.

The high frequency power supply unit 62 for plasma generation may include a high frequency power supply 74 and a matching unit 76. The high frequency power supply 74 may be configured to output a variable high frequency power $RF_H$ having an appropriate frequency (about 13.56 MHz or more) to generate plasma by a high frequency discharge. The matching unit 76 may include an automatic matching device capable of performing automatic matching, and may accommodate a variable reactance matching circuit for performing matching between an impedance of the high frequency power supply 74 and an impedance of a load (mainly, RF antenna group and plasma).

A processing gas supply unit for supplying a processing gas into the chamber 10 may include an annular manifold or buffer unit 77; multiple sidewall gas injection holes 78; and a gas supply line 82. The buffer unit 77 may be provided at an inside (or outside) of the sidewall of the chamber 10 to be located at a position slightly lower than the dielectric window 52. The sidewall gas injection holes 78 may be formed along a circumference at a regular interval and opened to the plasma generation space from the buffer unit 77. The gas supply line 82 may be extended from a processing gas supply source 80 to the buffer unit 77. The processing gas supply source 80 may include a flow rate controller and an opening/closing valve (not shown).

The main control unit 84 may include, for example, a micro computer and may control an operation of each component within this plasma etching apparatus, for example, the exhaust device 26, the high frequency power supplies 30 and 74, the matching units 32 and 76, the switch 42 for the electrostatic chuck 36, the capacitance varying units 70 and 72, the processing gas supply source 80, the chiller unit (not shown), and the heat transfer gas supply unit (not shown) as well as a whole operation (sequence) of the apparatus.

In order to perform an etching process in this inductively coupled plasma processing apparatus, when the gate valve 28 becomes open, the semiconductor wafer W as a process target may be loaded into the chamber 10 and mounted on the electrostatic chuck 36. Then, after closing the gate valve 28, an etching gas (generally, an mixture gas) may be introduced into the chamber 10 from the processing gas supply source 80 via the gas supply line 82, the buffer unit 77, and the sidewall gas injection holes 78 at a certain flow rate and a flow rate ratio. Subsequently, an internal pressure of the chamber 10 may be controlled to be a certain level by the exhaust device 26. Further, the high frequency power supply 74 may be turned on to output the high frequency power $RF_H$ for plasma generation at a certain power level. This RF power may be supplied to the coaxial antenna group 54 (the inner antenna 58/the outer antenna 60) through the matching unit 76 and the transformer 68. At this time, secondary currents $I_{2A}$ and $I_{2B}$ controlled by the variable capacitors 64 and 66, respectively, may flow through the inner antenna 58 and the outer antenna 60, respectively, of the coaxial antenna group 54.

Meanwhile, the high frequency power supply 30 may be turned on to output the high frequency power $RF_L$ for ion attraction control at a certain RF power level. This high frequency power $RF_L$ may be applied to the susceptor 12 via the matching unit 32 and the lower power supply rod 34. Further, a heat transfer gas (a He gas) may be supplied to a contact interface between the electrostatic chuck 36 and the semiconductor wafer W from the heat transfer gas supply unit. Furthermore, the switch 42 is turned on, and then, the heat transfer gas may be confined in the contact interface by the electrostatic force of the electrostatic chuck 36.

The etching gas injected through the sidewall gas injection holes 78 may be diffused uniformly into the processing space below the dielectric window 52. By the secondary currents $I_{2A}$ and $I_{2B}$ of the high frequency flowing through the coaxial antenna group 54 (the inner antenna 58/the outer antenna 60), a high frequency magnetic field may be generated around each of the antennas 58 and 60. Here, magnetic force lines of the high frequency magnetic field may penetrate the dielectric window 52 and pass through the plasma generation space within the chamber. As the high frequency power magnetic field changes with time, an inductive electric field of a high frequency may be generated in an azimuth direction within the processing space. Then, electrons accelerated by this inductive electric field in the azimuth direction may collide with molecules or atoms of the etching gas so as to be ionized. In the process, a donut-shaped plasma may be generated.

Radicals or ions in the donut-shaped plasma may be diffused in all directions within the large processing space. To be specific, while the radicals are isotropically introduced and the ions are attracted by a DC bias, the radicals and the ions may be supplied on an upper surface (target surface) of the semiconductor wafer W. Accordingly, plasma active species may perform chemical and physical reactions on the target surface of the semiconductor wafer W so as to etch a target film into a required pattern.

Herein, "a donut-shaped plasma" is not limited to only a ring-shaped plasma which is generated only at the radial outside in the chamber 10 without being generated at the radial inside (at a central area) therein. Further, "a donut-shaped plasma" may include a state where a volume or a density of the plasma generated at the radial outside is greater than that at the radial inside. Further, depending on a kind of a gas used for the processing gas, an internal pressure of the chamber 10, or the like, the plasma may have other shapes instead of "a donut shape".

In this inductively coupled plasma processing apparatus, it may be possible to reduce a RF power loss generated in the high frequency power supply unit 62 (particularly, the matching unit 76) due to a configuration to be described below. Further, it may also be possible to independently controlling the secondary currents $I_{2A}$ and $I_{2B}$ flowing through the inner antenna 58 and the outer antenna 60, respectively, of the coaxial antenna group 54, and readily control a plasma density distribution on the semiconductor wafer W in a diametrical direction. Therefore, it may become easy to uniformize plasma process, i.e. etching characteristics (etching rate, selectivity, etching profile or the like) characteristics in a diametric direction.

[Basic Configuration of Antenna and Transformer]

In the present embodiment, a main feature of the inductively coupled plasma processing apparatus may be a multiple number of closed-loop secondary circuits independent from each other between the coaxial antenna group 54 and the transformer 68.

Figure 2:
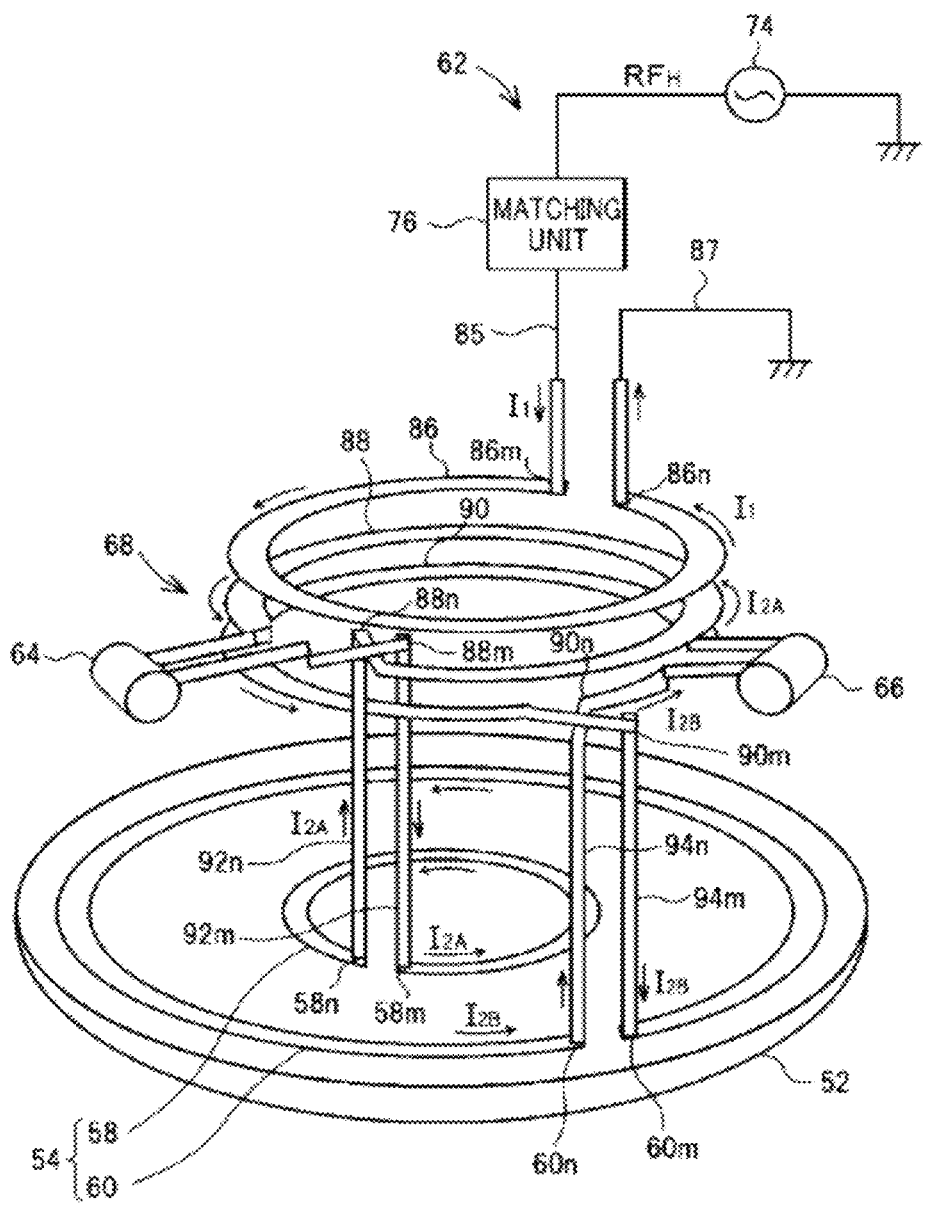
FIG. 2 shows a mechanical layout of a coaxial antenna group of the plasma processing apparatus, a variable capacitor and a transformer, and a connection configuration thereof in the plasma processing apparatus.

FIG. 2 shows a mechanical layout of the coaxial antenna group 54 (the inner antenna 58/the outer antenna 60), the variable capacitors 64 and 66, and the transformer 68, and a connection configuration thereof in the plasma processing apparatus.

As depicted in FIG. 2, in the transformer 68 provided above the dielectric window 52 within the antenna chamber 56, a single primary coil 86 and two secondary coils 88 and 90 may be arranged horizontally on a same plane, and axes thereof are vertically aligned with each other.

The primary coil 86 provided at the uppermost position may include, for example, a circular ring-shaped single turn coil. An end (RF inlet end) 86m thereof may be electrically connected to an output terminal of the matching unit 76 via a RF transmission line 85 of the high frequency power supply unit 62, and the other end (RF outlet end) 86n may be electrically connected to the chamber 10 or another ground potential member (not shown) via a RF return wire or an earth wire 87.

One secondary coil 88 may include a circular ring-shaped single turn coil having substantially the same diameter as the primary coil 86 and may be provided at a position near and below the primary coil 86. A pair of open ends 88m and 88n of this secondary coil 88 may be connected to a pair of open ends 58m and 58n of the inner antenna 58 via a pair of connection conductors 92m and 92n extended vertically, respectively.

The other secondary coil 90 may include a circular ring-shaped single turn coil having substantially the same diameter as the primary coil 86 and may be provided at a position near the primary coil 86 with the secondary coil 88 positioned therebetween. A pair of open ends 90m and 90n of this secondary coil 90 may be connected to a pair of open ends 60m and 60n of the outer antenna 60 via a pair of connection conductors 94m and 94n extended vertically, respectively.

In FIG. 2, the variable capacitors 64 and 66 are provided in loops of the secondary coils 88 and 90, respectively. However, the variable capacitors 64 and 66 may be provided on the way of the connection conductors 92m, 92n and 94m, 94n or in loops of the antennas 58 and 60.

Figure 3:
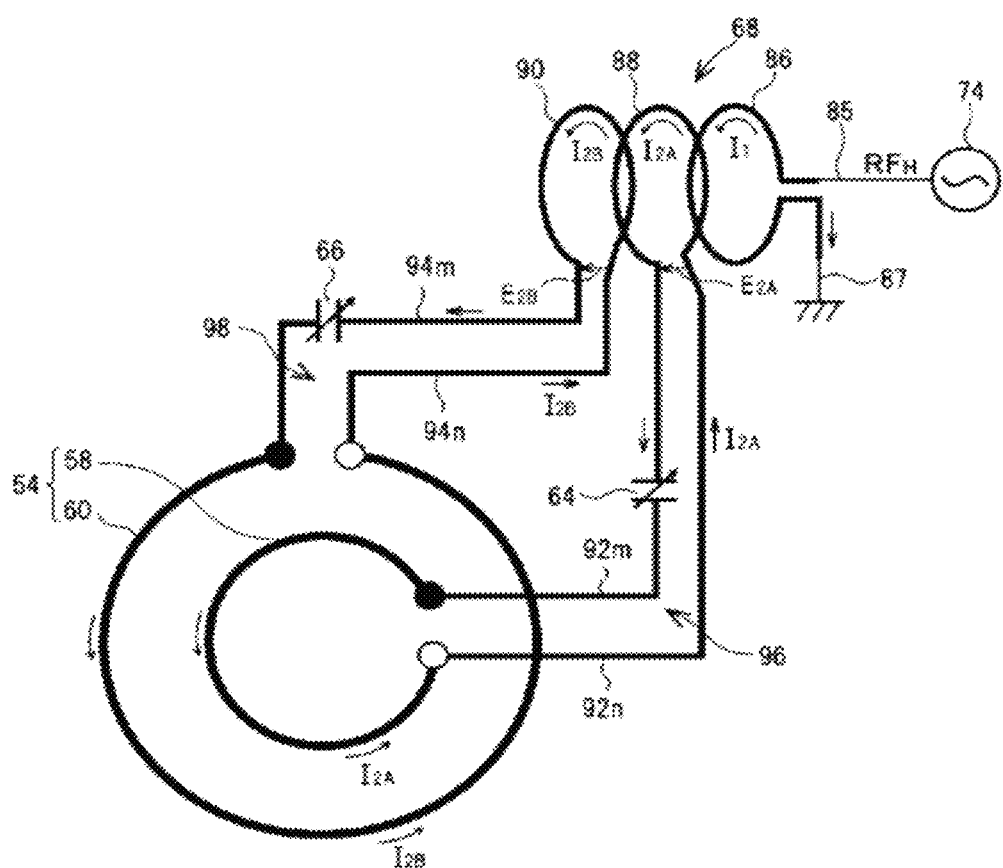
FIG. 3 shows an electrical connection configuration of the coaxial antenna group, the variable capacitor and the transformer.
Figure 3:
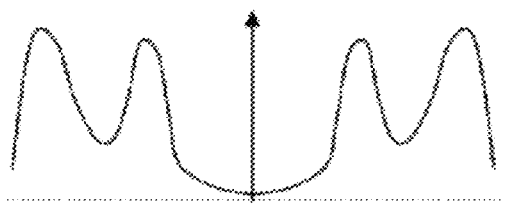

FIG. 3 shows an electrical connection configuration of the coaxial antenna group 54 (the inner antenna 58/the outer antenna 60), the variable capacitors 64 and 66, and the transformer 68. As depicted in FIG. 3, by the inner antenna 58, the connection conductors 92m and 92n, and the secondary coil 88, an independent closed-loop secondary circuit 96 may be formed and the variable capacitor 64 may be provided in this secondary circuit 96. Meanwhile, by the outer antenna 60, the connection conductors 94m and 94n, and the secondary coil 90, another independent closed-loop secondary circuit 98 may be formed, and the variable capacitor 66 may be provided in this secondary circuit 98.

In this inductively coupled plasma processing apparatus, if the high frequency power $RF_H$ for plasma generation is output from the high frequency power supply 74 during a process, a primary current $I_1$ of the high frequency may flow from the output terminal of the matching unit 76 through the RF transmission line 85, the primary coil 86 of the transformer 68, and the earth wire 87. Thus, magnetic force lines (magnetic flux) generated around the primary coil 86 by the primary current $I_1$ of the high frequency flowing through the primary coil 86 may be interlinked with both of the secondary coils 88 and 90. As the magnetic flux changes with time, induced electromotive powers $E_{2A}$ and $E_{2B}$ may be generated at both of the secondary coils 88 and 90 based on electromagnetic induction. As a result, secondary currents (induced currents) $I_{2A}$ and $I_{2B}$ of the high frequency may flow within both of the secondary circuits 96 and 98, respectively. Here, if combined impedances within both of the secondary circuits 96 and 98 are denoted as $Z_A$ and $Z_B$, respectively, the secondary currents $I_{2A}$ and $I_{2B}$ can be represented by the following equations (1) and (2):

$$I_{2A}=E_{2A}/Z_A \tag{1}$$

$$I_{2B}=E_{2B}/Z_B \tag{2}$$

Accordingly, the secondary currents $I_{2A}$ and $I_{2B}$ flow through the inner antenna 58 and the outer antenna 60, respectively. Therefore, an AC magnetic field of the high frequency power distributed in a loop shape may be generated around the inner antenna 58 and the outer antenna 60. Further, below the dielectric window 52, magnetic force lines may be formed at a relatively inner region (lower region) of the processing space in a radial direction.

Figure 4:
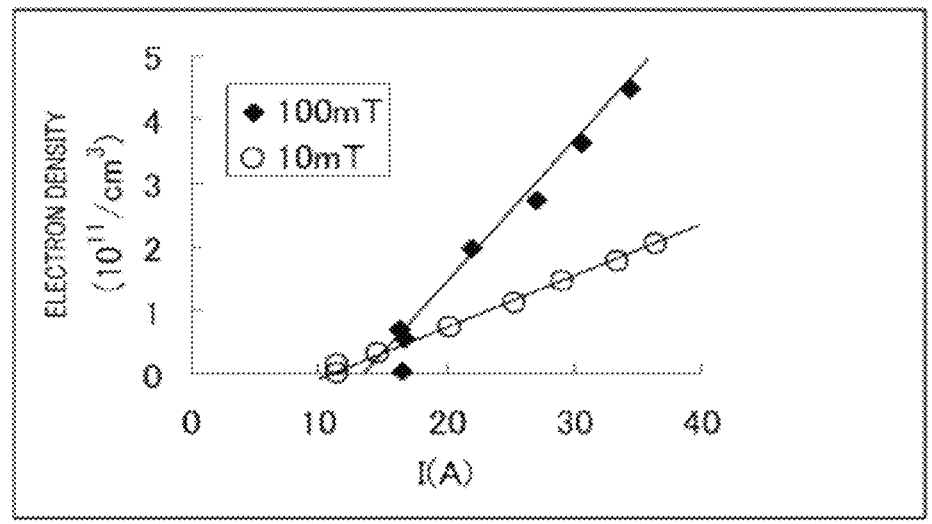
FIG. 4 provides experimental data showing a relationship between a current flowing through a circular ring-shaped antenna and an electron density right below the antenna.

In this case, a diametric directional (horizontal) component of a magnetic flux density in the processing space may be zero (0) constantly at a central region and a periphery of the chamber 10 regardless of a magnitude of the secondary current. Further, the radial directional (horizontal) component of a magnetic flux density in the processing space may have a maximum value at a certain portion therebetween. A strength distribution of the inductive electric field in the azimuth direction generated by the AC magnetic field of the high frequency may have the same pattern as a magnetic flux density distribution in a diametrical direction. That is, an electron density distribution within the donut-shaped plasma in the diametrical direction may substantially correspond to a current distribution within the coaxial antenna group 54 in a macro view. As depicted in FIG. 4, it has been verified by an experiment that there is a substantially linear relationship between a current flowing through a circular ring-shaped antenna and an electron density right below the antenna.

In the present embodiment, the coaxial antenna group 54 may be different from a typical vortex-shaped coil wound from its center or an inner end to an outer end. Further, the coaxial antenna group 54 may include the circular ring-shaped inner antenna 58 locally placed at the central region of the chamber 10 and the circular ring-shaped outer antenna locally placed in a vicinity of the sidewall of the chamber 10. A current distribution within the coaxial antenna group 54 in the diametrical direction may be bipolarized in vicinities of the antennas 58 and 60.

Therefore, in the donut-shaped plasma generated below (inside) the dielectric window 52 of the chamber 10, a current density (i.e. plasma density) may be remarkably increased (maximized) at both positions right below the inner antenna 58 and right below the outer antenna 60. Thus, a current density distribution within the donut-shaped plasma may not be uniform in a diametrical direction and may have an uneven profile. However, since the plasma is diffused in all directions within the processing space of the chamber 10, a plasma density in a vicinity of the susceptor 12, i.e. on the semiconductor wafer W, may become very uniform.

In the present embodiment, by controlling balance between the secondary currents $I_{2A}$ and $I_{2B}$ flowing through the inner antenna 58 and the outer antenna 60, respectively, it may be possible to readily control a plasma density distribution in a vicinity of the susceptor 12, i.e. on the semiconductor wafer W. Further, it may be possible to readily uniformize plasma process characteristics. In this case, the balance between the secondary currents $I_{2A}$ and $I_{2B}$ can be controlled by varying electrostatic capacitances of the variable capacitors 64 and 66 as described below.

When the electrostatic capacitances of the variable capacitors 64 and 66 are denoted as $C_{64}$ and $C_{66}$, respectively, and self-inductances and resistances (including resistance components caused by a power absorbed by plasma) within the secondary circuits 96 and 98 are denoted as $L_{96}$, $R_{96}$ and $L_{98}$, $R_{98}$, respectively, the combined impedances $Z_A$ and $Z_B$ within the secondary circuits 96 and 98 can be represented by the following equations (3) and (4):

$$Z_A=R_{96}+i(\omega L_{96}-1/\omega C_{64}) \tag{3}$$

$$Z_B = R_{98} + i(\omega L_{98} - 1/\omega C_{66}) \quad (4)$$

Here, $\omega$ denotes an angular frequency and if a frequency of the high frequency power $RF_H$ for plasma generation is denoted as f, $\omega$ is $2\pi f$.

Therefore, the above-described equations (1) and (2) are equivalent to the following equations (5) and (6):

$$I_{2A} = E_{2A}/\{R_{96} + i(\omega L_{96} - 1/\omega C_{64})\} \quad (5)$$

$$I_{2B} = E_{2B}/\{R_{98} + i(\omega L_{98} - 1/\omega C_{66})\} \quad (6)$$

In the transformer 68, if mutual inductances between the primary coil 86 and the respective secondary coils 88 and 90 are constant, when the primary current $I_1$ flows into the primary coil 86 of the transformer 68 from the high frequency power supply unit 62, the induced electromotive powers $E_{2A}$ and $E_{2B}$ generated within the respective secondary coils 88 and 90 may be determined. Further, the self-inductances $L_{96}$ and $L_{98}$ and the resistances $R_{96}$ and $R_{98}$ within the respective secondary coils 96 and 98 may be regarded as constant. Therefore, by varying the electrostatic capacitances $C_{64}$ and $C_{66}$ of the variable capacitors 64 and 66, the secondary currents $I_{2A}$ and $I_{2B}$ flowing through the inner antenna 58 and the outer antenna 60, respectively, can be controlled independently.

Meanwhile, in the high frequency power supply unit 62, a self-inductance of the primary coil 86 is much greater than the mutual inductances between the respective secondary coils 88 and 90. Therefore, a change in a load reactance viewed from the primary coil 86 may be small. Accordingly, effects of the secondary currents $I_{2A}$ and $I_{2B}$ on the primary coil 86 are not significant. For this reason, when viewed from the output terminal of the matching unit 76, the load impedance may be considered as an impedance of only the primary coil 86. That is, a power consumed at a load circuit of the secondary coils 88 and 90 may be regarded as a consumed power caused by generation of an apparent resistance at the primary coil 86. Thus, if the multiple secondary coils 88 and 90 are provided in the same manner as the present embodiment, the apparent resistances, corresponding to the power consumed within the respective secondary circuits 96 and 98, may be increased. That is, the resistances corresponding to the powers consumed within the respective secondary circuits 96 and 98 may be connected in series to the primary coil 86 and a combined resistance may be doubled.

In a general matching unit, as a load resistance is increased, a power consumed by resistance components within a matching circuit may become smaller than a RF power consumed at a load. Accordingly, a RF power transmission efficiency may be enhanced. In the present embodiment, the antennas 58 and 60 of the coaxial antenna group 54 may be electrically connected to the primary coil 86 via the secondary coils 88 and 90, respectively. Therefore, a load resistance of the primary coil 86 may be increased and a RF power transmission efficiency of the high frequency power supply unit 62 may be enhanced. Accordingly, a RF power supplied to a plasma load may be increased and a plasma generation efficiency may be enhanced.

In case of omitting the transformer 68 and directly connecting the inner antenna 58 and the outer antenna 60 of the coaxial antenna group 54 in parallel with the output terminal of the matching unit 76, a combined load resistance may be reduced to half and a current flowing in the high frequency power supply unit 62 may be doubled. Accordingly, a power consumed within the high frequency power supply unit (particularly, the matching unit 76) may be increased and a RF power transmission efficiency may become decreased.

The electrostatic capacitances $C_{64}$ and $C_{66}$ of the variable capacitors 64 and 66 may be determined in a range in which reactances within the secondary circuits 96 and 98 are negative. That is, the electrostatic capacitances $C_{64}$ and $C_{66}$ may be selected in a variable range in which the electrostatic capacitances $C_{64}$ and $C_{66}$ are smaller than an electrostatic capacitance that allows a serial resonance to occur within the secondary circuits 96 and 98.

If the electrostatic capacitances $C_{64}$ and $C_{66}$ are varied in a range in which the electrostatic capacitances $C_{64}$ and $C_{66}$ are smaller than the electrostatic capacitance that allows the serial resonance to occur, by increasing values (capacitance positions) of the electrostatic capacitances $C_{64}$ and $C_{66}$ from minimum values, it may be possible to gradually increase values of the secondary currents $I_{2A}$ and $I_{2B}$ from approximately zero. Further, a circumferential direction of the secondary currents $I_{2A}$ and $I_{2B}$ flowing through the respective secondary coils 88 and 90 may be identical to that of the primary current $I_1$ flowing through the primary coil 86. As a result, a RF power transmission efficiency of the transformer 68 can be enhanced.

If a circumferential direction of the secondary currents $I_{2A}$ and $I_{2B}$ flowing through the respective secondary coils 88 and 90 may be opposite to that of the primary current $I_1$ flowing through the primary coil 86, a magnetic field may be weakened and a RF power transmission efficiency of the transformer 68 may be decreased.

Although such an advantage in efficiency is not obtained, the electrostatic capacitances $C_{64}$ and $C_{66}$ of the variable capacitors 64 and 66 may be selected from a range in which the electrostatic capacitances $C_{64}$ and $C_{66}$ are greater than the electrostatic capacitance that allows the serial resonance to occur. If one of the electrostatic capacitances $C_{64}$ and $C_{66}$ is greater than the electrostatic capacitance that allows the serial resonance to occur, a current flowing through the inner antenna 58 may flow in a direction opposite to a current flowing through the outer antenna 60. As a result, a plasma distribution can be greatly changed. Meanwhile, if both the electrostatic capacitances $C_{64}$ and $C_{66}$ are greater than the electrostatic capacitance that allows the serial resonance to occur, a current flowing through the inner antenna 58 may flow in the same direction as a current flowing through the outer antenna 60. As a result, it may be possible to generate plasma uniformly and efficiently.

[Experimental Example of Antenna and Transformer]

Hereinafter, there will be explained an experimental example of an antenna and a transformer applicable to the inductively coupled plasma processing apparatus in accordance with the present embodiment.

Figure 5:
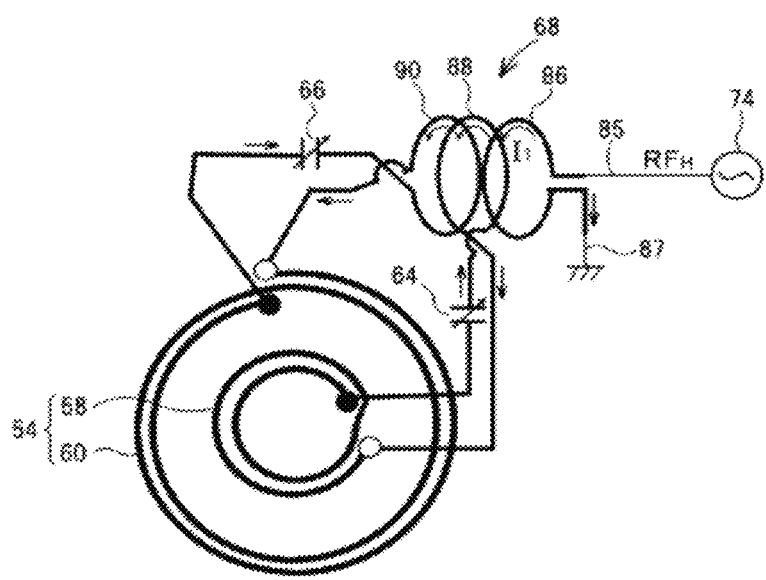
FIG. 5 shows an example of a coil configuration of the antenna.

FIG. 5 shows an example configuration in which the inner antenna 58 and/or the outer antenna 60 of the coaxial antenna group 54 have vortex-shaped coils (spiral coils). Although not illustrated, the inner antenna 58 and/or the outer antenna 60 have a circular ring-shaped multiple turn coil (a concentric coil having the same radius in each circle).

As the number of turns of each antenna 58 and 60 of the coaxial antenna group 54 is increased, when the same current flows, a magnetomotive force can be increased. The secondary currents $I_{2A}$ and $I_{2B}$ flowing through the respective antennas 58 and 60 can be variably controlled independently from each other by the variable capacitors 64 and 66.

Figure 6:
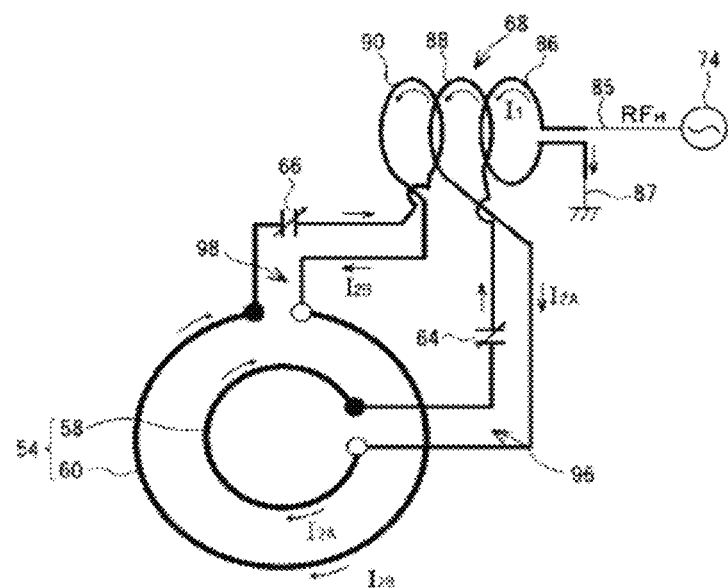
FIG. 6 shows an example of a loop configuration between the antenna and the transformer.

FIG. 6 shows an example configuration of the secondary circuits 96 and 98 including closed-loops having reverse connection points. By way of example, as depicted in FIG. 2, if a paired connection between upper ends of the connection conductors $92_m$, $92_n$ and $94_m$, $94_n$ and open ends of the secondary coils 88 and 90 is changed, or if a paired connection between lower ends of the connection conductors $92_m$, $92_n$ and $94_m$, $94_n$ and open ends of the antennas 58 and 60 is changed, an electrical configuration as depicted in FIG. 6 can be obtained.

By way of example, if winding directions of the secondary coils 88 and 90 in the transformer 68 to be described below are opposite to each other, by reversely changing connection points of the closed-loop of any one of the secondary circuits 96 and 98, the secondary currents $I_{2A}$ and $I_{2B}$ flowing through the inner and outer antennas 58 and 60, respectively, can flow in the same circumferential direction.

Figure 7:
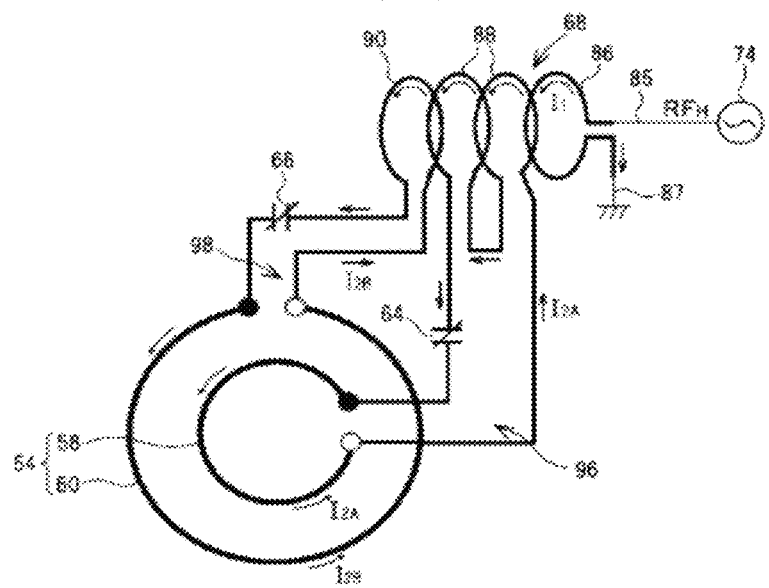
FIG. 7 shows an example illustrating the number of turns of a secondary coil in the transformer.

FIG. 7 shows an example configuration in which at least one of the secondary coils 88 and 90 (the secondary coil 88 in the drawing) is formed of a multiple turn coil.

Figure 8:
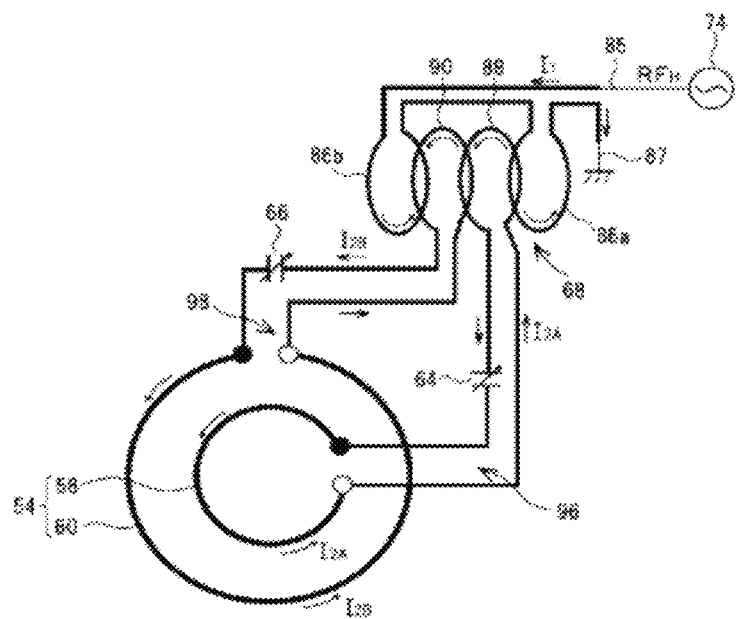
FIG. 8 shows an example of a division and arrangement of a primary coil in the transformer.

FIG. 8 shows an example configuration in which the primary coil 86 is divided into multiple (two in the drawing) coil segments. In this example configuration, the primary coil 86 may be electrically connected in series, and may be divided into first and second primary coil segments 86a and 86b with a certain gap in a coil axis direction. The secondary coils 88 and 90 may be positioned between these two primary coil segments 86a and 86b. With this transformer configuration, a magnetic flux generated by the primary current $I_1$ flowing through the primary coil 86 may be interlinked with the secondary coils 88 and 90 more efficiently and equally.

Figure 9:
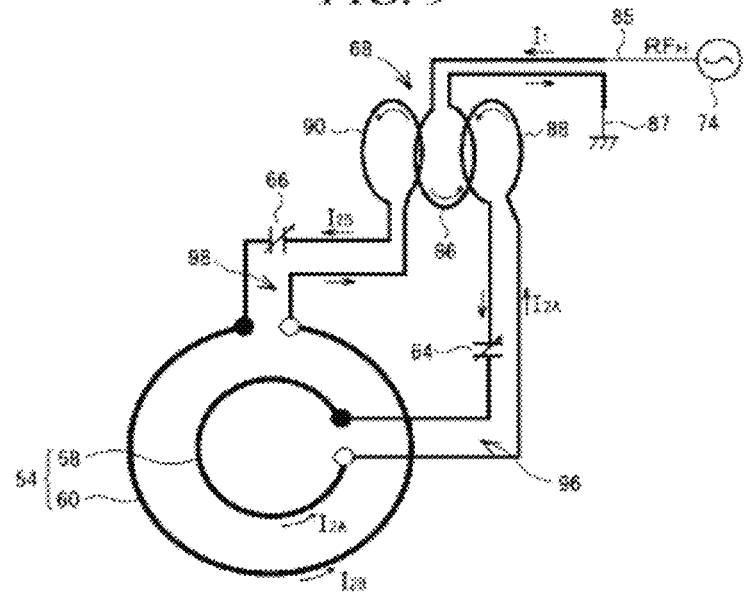
FIG. 9 shows an example of arrangement of the primary coil and the secondary coil in the transformer.

FIG. 9 shows an example configuration in which the primary coil 86 is positioned between the secondary coils 88 and 90 in the coil axis direction. With this configuration, it may be possible to enhance an efficiency and uniformity in an electromagnetic induction coupling between the primary coil 86 and the secondary coils 88 and 90.

Figure 10A:
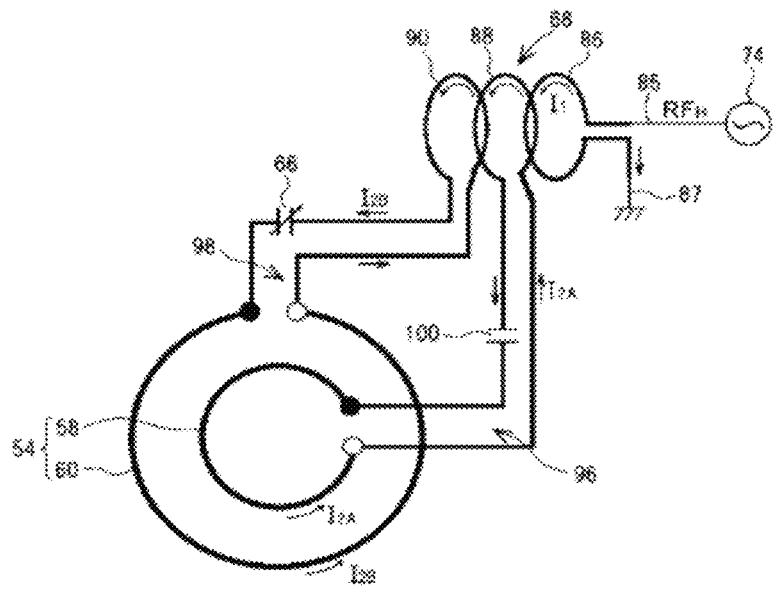
FIG. 10A shows an example configuration of providing a fixed capacitor in a secondary circuit.

FIG. 10A shows an example configuration in which the variable capacitor 66 is provided at the secondary circuit 98, and a fixed capacitor 100 is provided at the secondary circuit 96. In this case, while a value of the secondary current $I_{2A}$ flowing through the inner antenna 58 is maintained constantly, a value of the secondary current $I_{2B}$ flowing through the outer antenna 60 can be controlled by varying a capacitance of the variable capacitor 66. Further, a balance of a magnetomotive force between the inner antenna 58 and the outer antenna 60 can be also controlled.

Figure 10B:
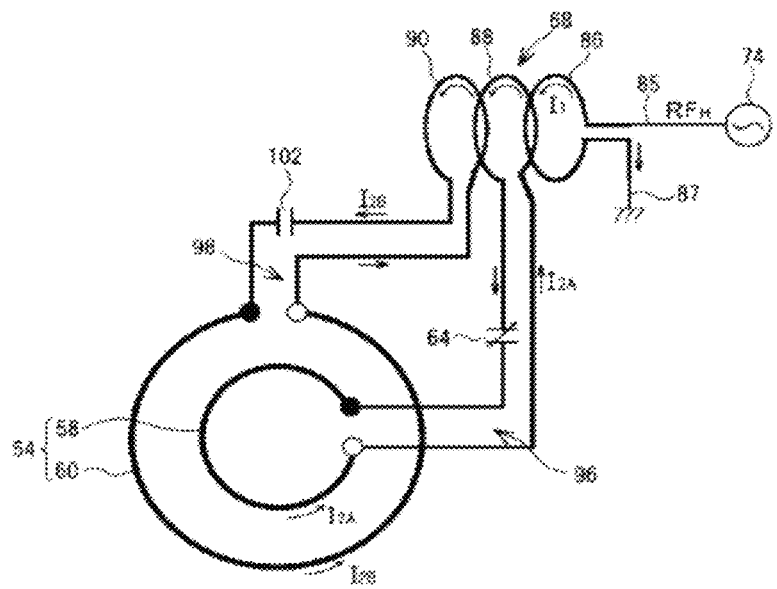
FIG. 10B shows another example configuration of providing the fixed capacitor in the secondary circuit.

As depicted in FIG. 10B, the variable capacitor 64 may be provided at the secondary circuit 96, and a fixed capacitor 102 may be provided at the secondary circuit 98. In this case, while a value of the secondary current $I_{2B}$ flowing through the outer antenna 60 is maintained constantly, a value of the secondary current $I_{2A}$ flowing through the inner antenna 58 can be controlled by varying a capacitance of the variable capacitor 64. Further, a balance of a magnetomotive force between the inner antenna 58 and the outer antenna 60 can also be controlled.

Figure 11:
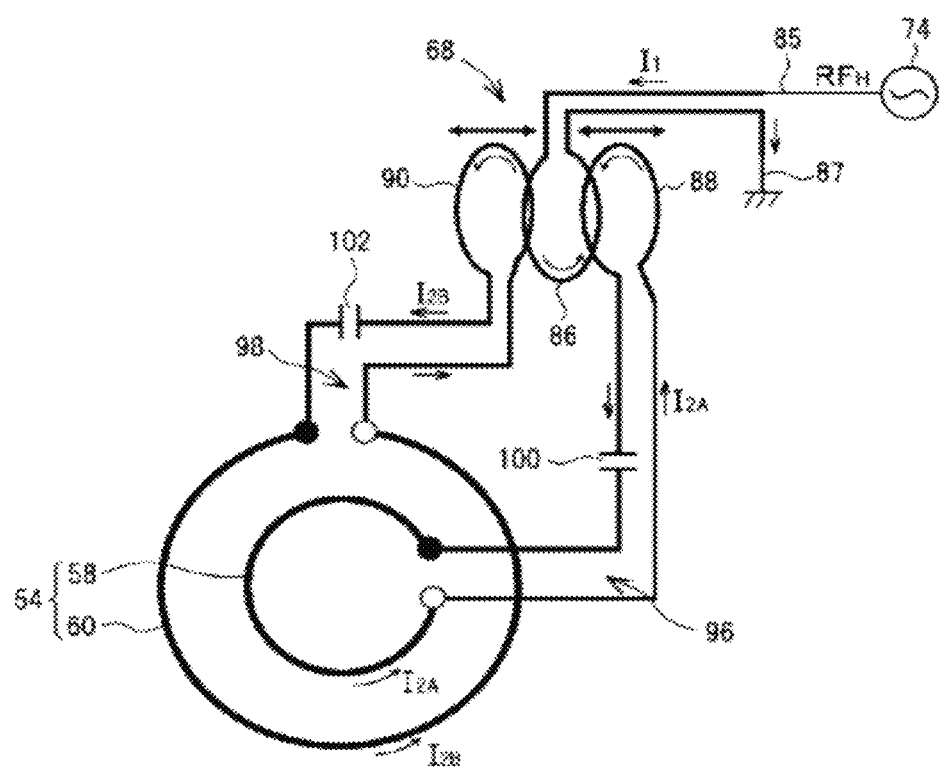
FIG. 11 shows an example of variably controlling a distance between the primary coil and the secondary coil in the transformer.

FIG. 11 shows an example configuration of variably controlling a distance between the primary coil 86 and at least one of the secondary coils 88 and 90 in a coil axis direction. As a means for variably controlling a distance between the coils, for example, a ball screw or a rack and pinion (not shown) can be used.

If the primary coil 86, and the secondary coils 88 and 90 are provided in parallel to each other without using a core, the mutual inductances between the primary coil 86 and the respective secondary coils 88 and 90 as well as induced electromotive powers generated at the respective secondary coils 88 and 90 may be largely dependent on the distance between the coils. That is, as the distance is decreased, the mutual inductances (induced electromotive powers) may be increased. Further, as the distance is increased, the mutual inductances (induced electromotive powers) may be decreased.

Therefore, by way of example, as shown in FIG. 10A, if the fixed capacitor 100 is provided at the secondary circuit 96, the distance between the primary coil 86 and the secondary coil 88 may be varied in the transformer 68. As a result, the induced electromotive power $E_{2A}$ generated at the secondary coil 88 can be varied, and the secondary current $I_{2A}$ flowing through the inner antenna 58 can be varied.

Figure 12A:
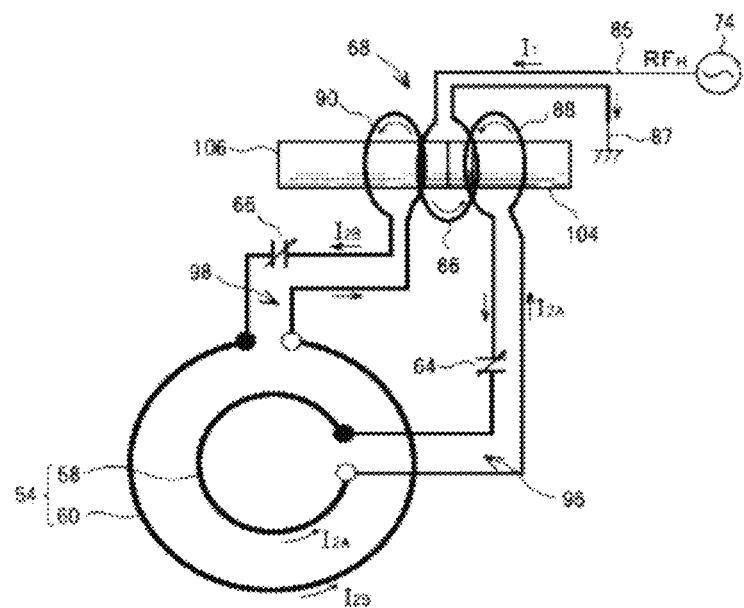
FIG. 12A shows an example configuration of a rod-shaped core in the transformer.

FIG. 12A shows an example configuration of a rod-shaped core interlinked with the primary coil 86 and at least one of the secondary coils 88 and 90. In this example configuration, a rod-shaped core 104 interlinked with the primary coil 86 and the secondary coil 88, and a rod-shaped core 106 interlinked with the primary coil 86 and the secondary coil 90 are integrally formed to contact with each other. In this way, since the transformer 68 includes the cores 104 and 106, a self-resistance of the transformer 68 can be reduced, and the RF power transmission efficiency of the transformer 68 can be enhanced.

The core used in the transformer 68 may be a member (iron cores), interlinked with the primary coil and the secondary coils, to increase the mutual inductances between the primary coil and the secondary coils. The core may be made of a material (for example, Ferrite) having a relative permeability greater than about 1.

Figure 12B:
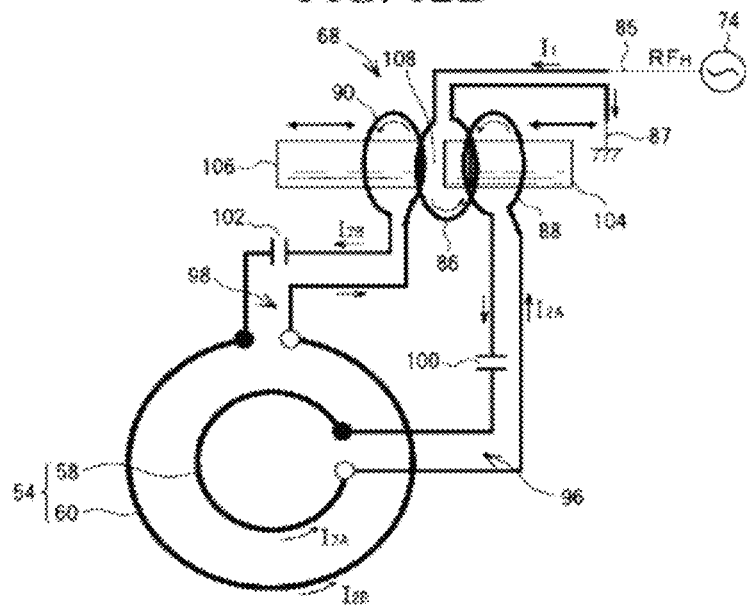
FIG. 12B shows an example of moving or displacing the rod-shaped core in an axial direction in the transformer.

In this case, as depicted in FIG. 12B, the cores 104 and 106 may be provided so as to be movable and displaceable in an axis direction. The self-resistance and the mutual inductances of the transformer 68 can be controlled by varying a size of a gap 108 between these cores 104 and 106.

Figure 13:
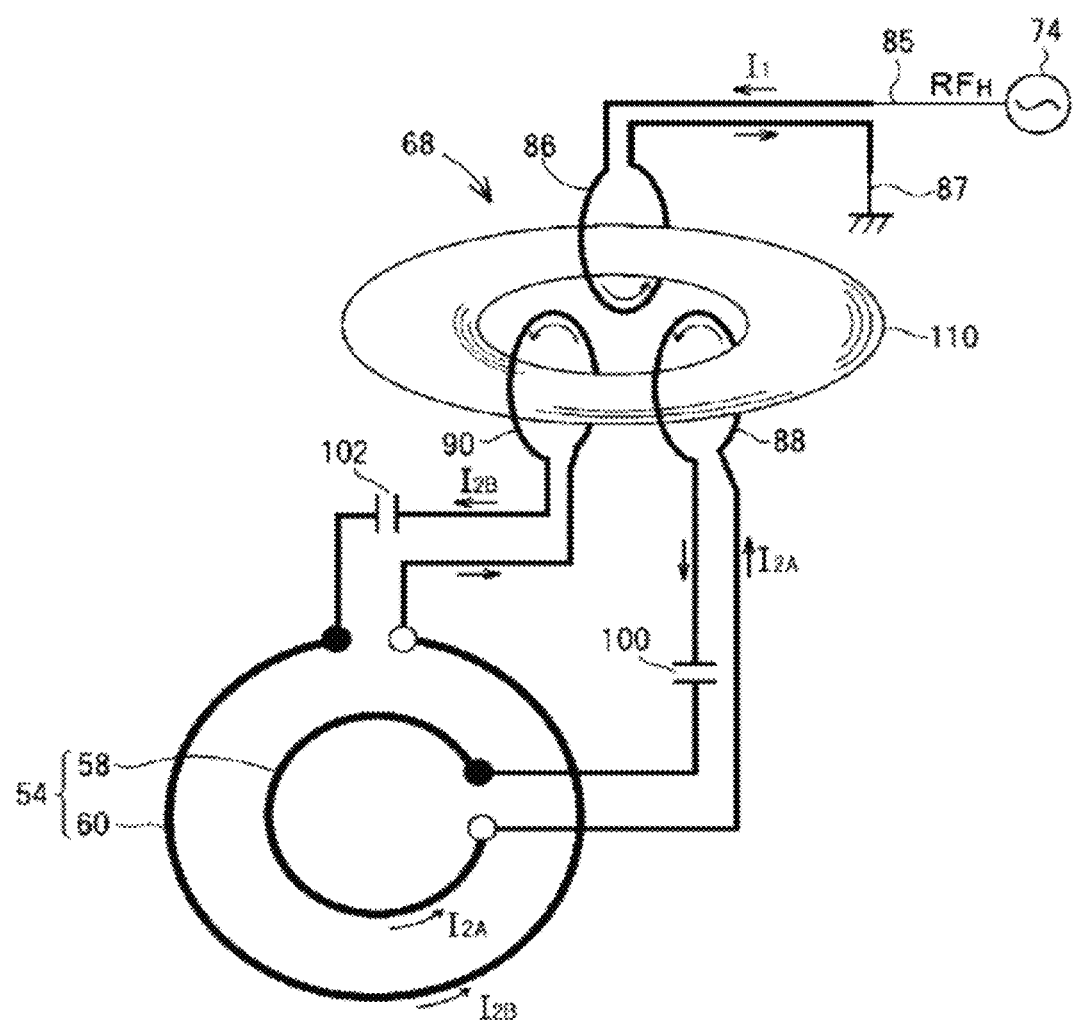
FIG. 13 shows an example configuration of a ring-shaped core (endless type) in the transformer.

FIG. 13 shows an example configuration of a ring-shaped or an endless-typed core interlinked with all of the primary coil 86 and the secondary coils 88 and 90.

Figure 14:
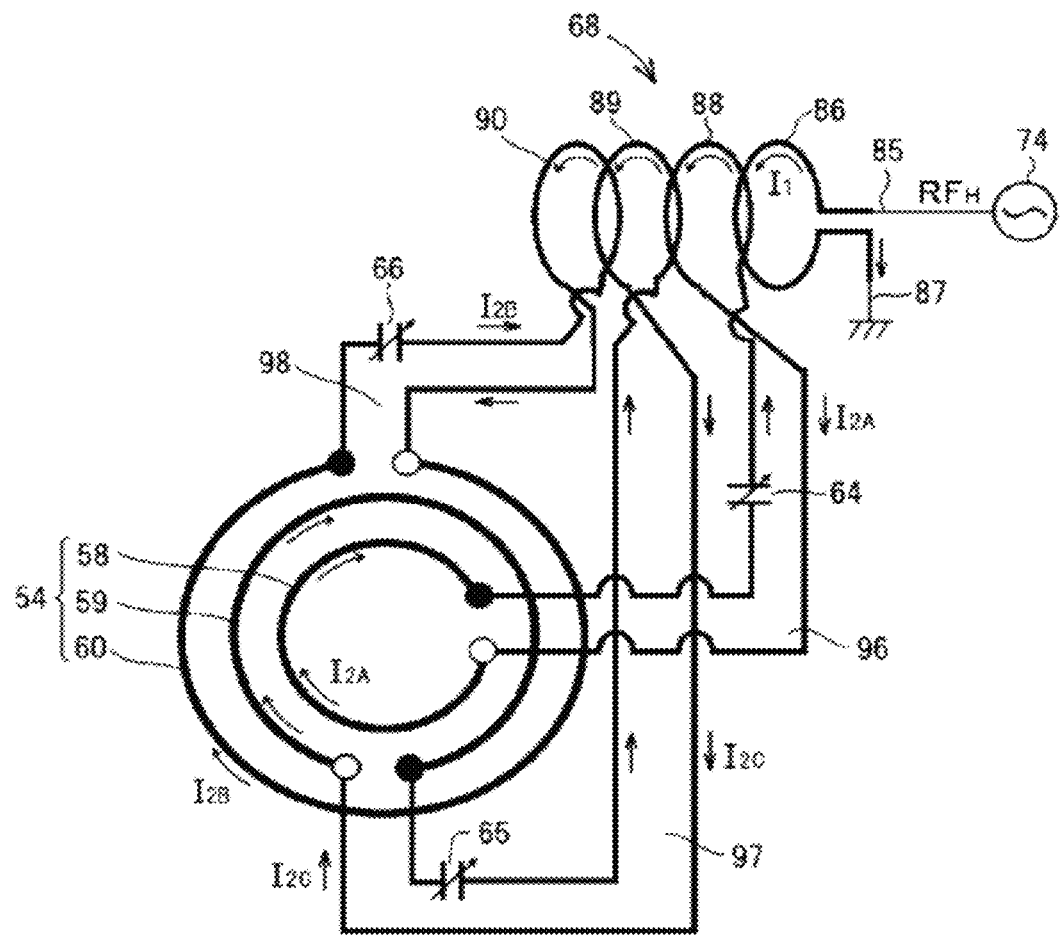
FIG. 14 shows an example of providing an intermediate antenna between an inner antenna and an outer antenna of the coaxial antenna group.

FIG. 14 shows an example of providing an intermediate antenna 59 between the inner antenna 58 and the outer antenna 60 of the coaxial antenna group 54. In this case, a secondary coil 89 may be electrically connected to the intermediate antenna 59 to form a closed-loop secondary circuit 97. The secondary coil 89 may be provided in parallel with the other secondary coils 88 and 90 in a vicinity of the primary coil 86 in the transformer 68. In the secondary circuit 97, a capacitor, for example, a variable capacitor 65 may be provided.

It has been confirmed by the experiment that if the intermediate antenna 59 is provided between the inner antenna 58 and the outer antenna 60, by controlling a secondary current $I_2C$ flowing through the intermediate antenna 59 to be about $\frac{1}{10}$ of the secondary currents $I_{2A}$ and $I_{2B}$ flowing through the inner antenna 58 and the outer antenna 60, respectively, it may be possible to uniformize a plasma density of the donut-shaped plasma generated right below the antennas within the chamber 10.

This is because even if the intermediate antenna 59 is not provided, plasma generated right below the inner antenna 58 and the outer antenna 60 may be diffused in a diametrical direction, and, thus, as depicted in FIG. 3, the plasma having a considerable density may exist right below an intermediate space between two antennas 58 and 60. Therefore, if a small amount of the second current $I_{2C}$ (for example, about 0.4 A to about 1.5 A) is allowed to flow through the intermediate antenna 59 in the same direction as the secondary currents $I_{2A}$ and $I_{2B}$ flowing through the other antennas 58 and 60 along a circumference, inductively coupled plasma may be appropriately increased right below the intermediate antenna 59. Thus, a plasma density becomes uniformized in a diametrical direction.

Here, in order for a reactance of the second circuit 97 to have a negative value, an electrostatic capacitance $C_{65}$ of the variable capacitor 65 may be controlled to be close to a minimum value in a range where the electrostatic capacitance $C_{65}$ is smaller than an electrostatic capacitance that allows a serial resonance to occur within the second circuit 97. Accordingly, it may be possible to control the second current $I_{2C}$ flowing through the intermediate antenna 59 to have a very small value.

Figure 15A:
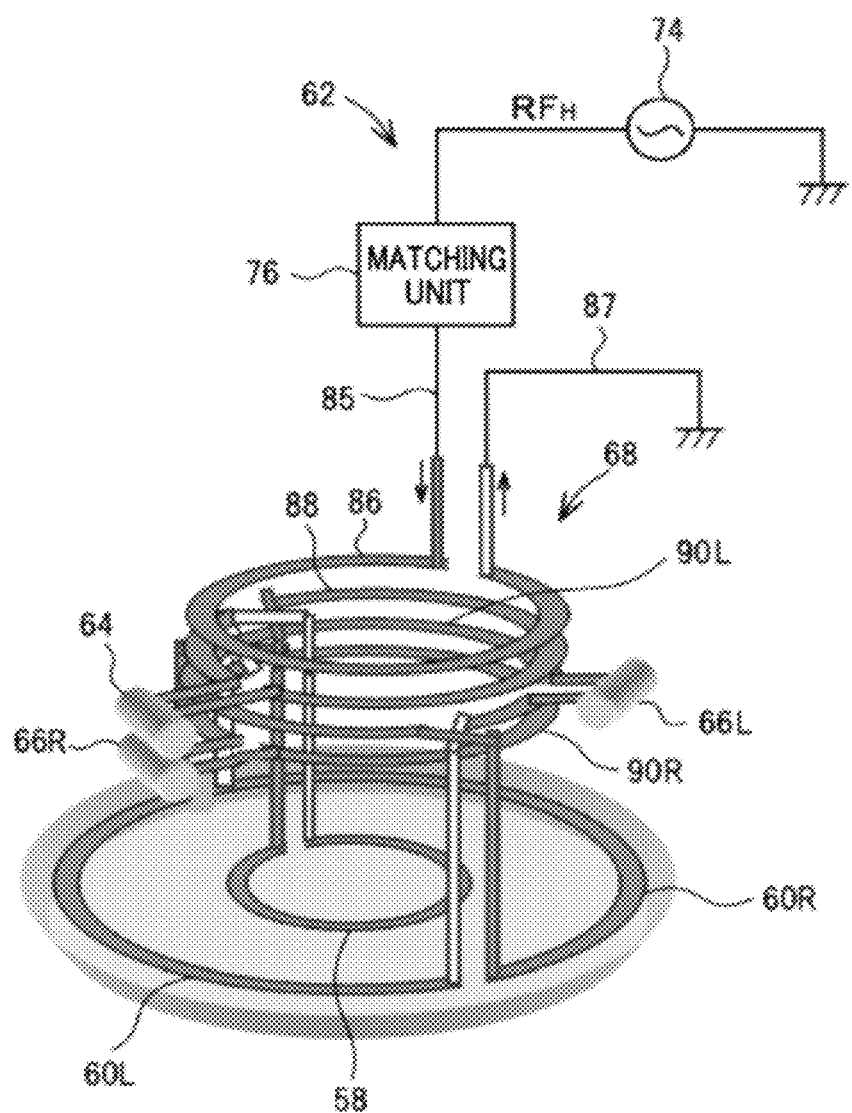
FIG. 15A shows an example of dividing the outer antenna of the coaxial antenna group into multiple antenna segments.

FIG. 15A shows an example configuration in which the outer antenna 60 of the coaxial antenna group 54 is divided into multiple (two in this example) antenna segments 60L and 60R in a circumferential direction. Further, multiple (two) secondary segments 90L and 90R corresponding to the outer antenna 60 is provided in the transformer 68. As depicted in the drawing, each of these antenna segments 60L and 60R may be formed in a semicircular shape, and positioned in series in an azimuth direction so as to form a single circle.

Figure 15B:
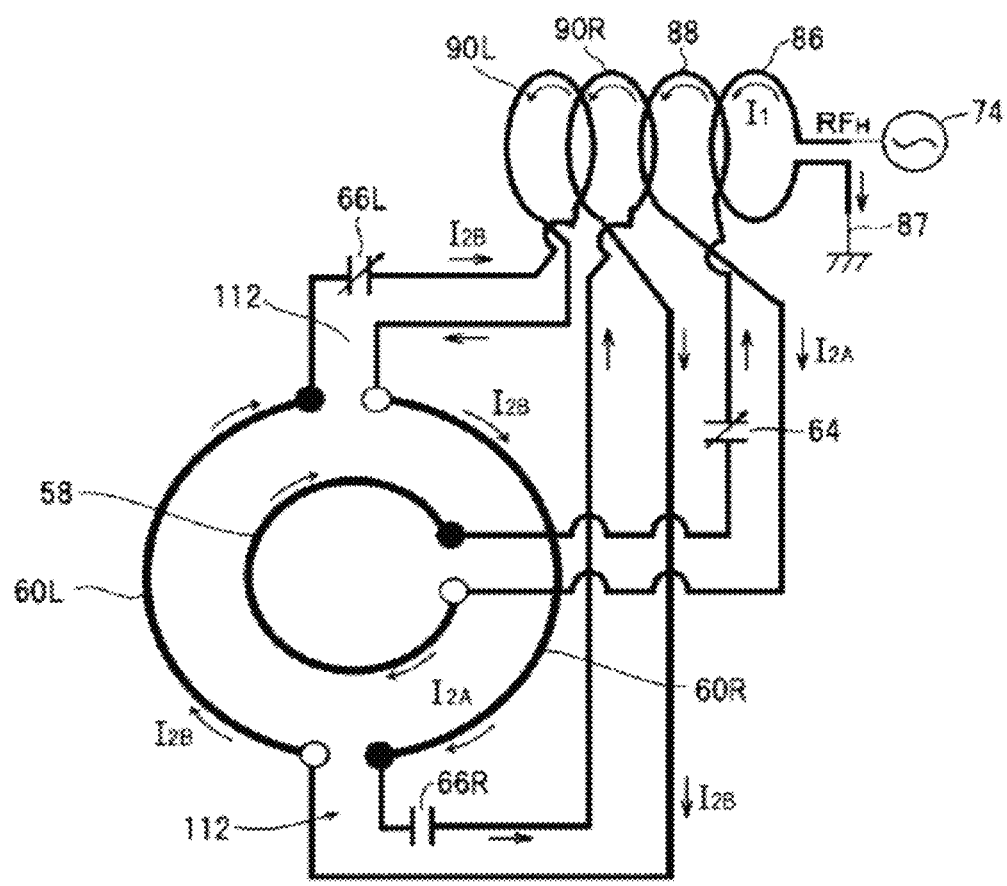
FIG. 15B shows an example of providing a single closed-loop secondary circuit between two antenna segments and two secondary coils.

In this case, as depicted in FIG. 15B, the antenna segments 60L and 60R may be electrically connected to the secondary coils 90L and 90R. As a result, a single closed-loop secondary circuit 112 may be formed between the two antenna segments 60L and 60R and the two secondary coils 90L and 90R. In this secondary circuit 112, a single or multiple (two in the drawing) capacitors 66L and 66R may be provided at a certain position within the closed-loop, and at least one (the capacitor 66L in the drawing) may be a variable capacitor.

Figure 15C:
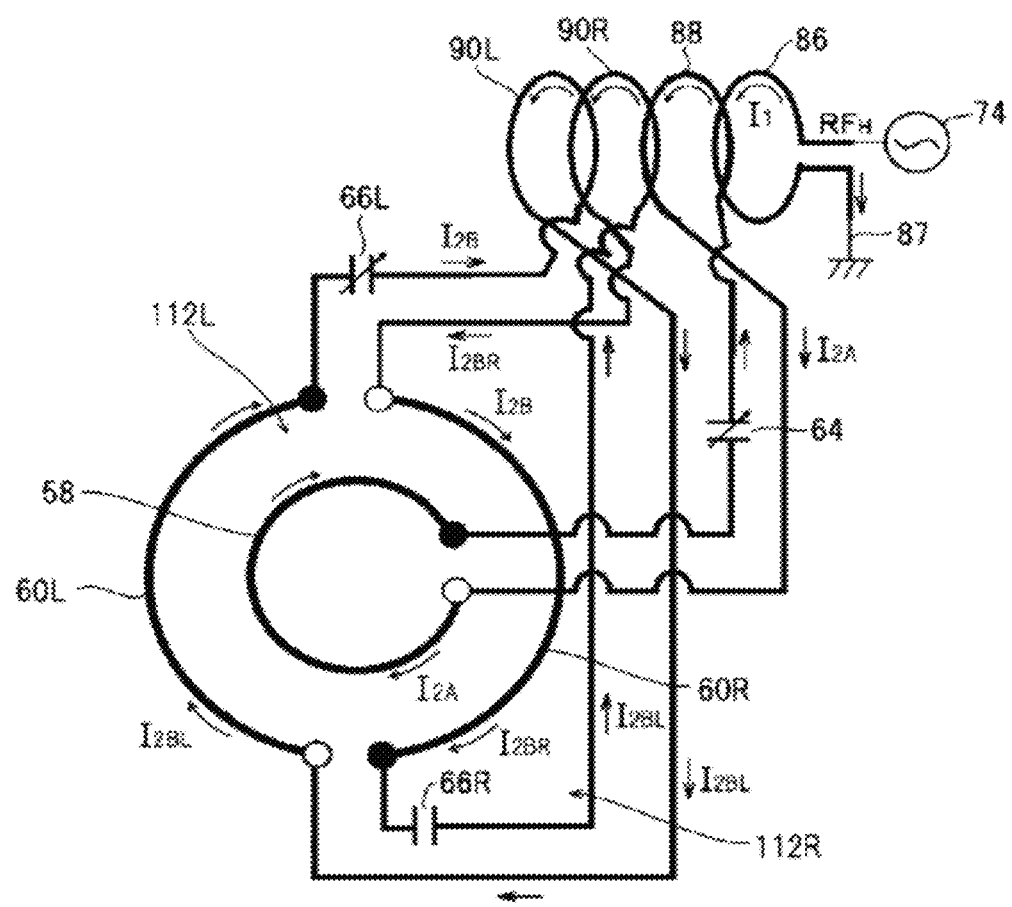
FIG. 15C shows an example of providing two independent closed-loop secondary circuits between two antenna segments and two secondary coils.

Otherwise, as depicted in FIG. 15C, the antenna segment 60L may be electrically connected to the secondary coil 90L such that an independent closed-loop secondary circuit 112L may be formed between the antenna segment 60L and the secondary coil 90L. Further, the other antenna segment 60R may be electrically connected to the other secondary coil 90R such that an independent closed-loop secondary circuit 112R may be formed between the antenna segment 60R and the secondary coil 90R.

Thus, when the outer antenna 60 having the longest overall length is divided into multiple antenna segments 60L and 60R, a wavelength effect or a voltage drop within the outer antenna 60 may be determined depending on lengths of the respective antenna segments 60L and 60R. Therefore, the lengths of the respective antenna segments 60L and 60R may be controlled so as not to cause the wavelength effect within the respective antenna segments 60L and 60R and so as to suppress an increase in an amount of the voltage drop. Thus, it may be possible to solve problems of the wavelength effect or the voltage drop within the outer antenna 60. Further, the inner antenna 58 also can be divided into multiple antenna segments.

[Experimental Example of Automatic Matching Device]

Hereinafter, there will be explained an experimental example of an automatic matching device applicable to the inductively coupled plasma processing apparatus in accordance with the present embodiment.

Figure 16:
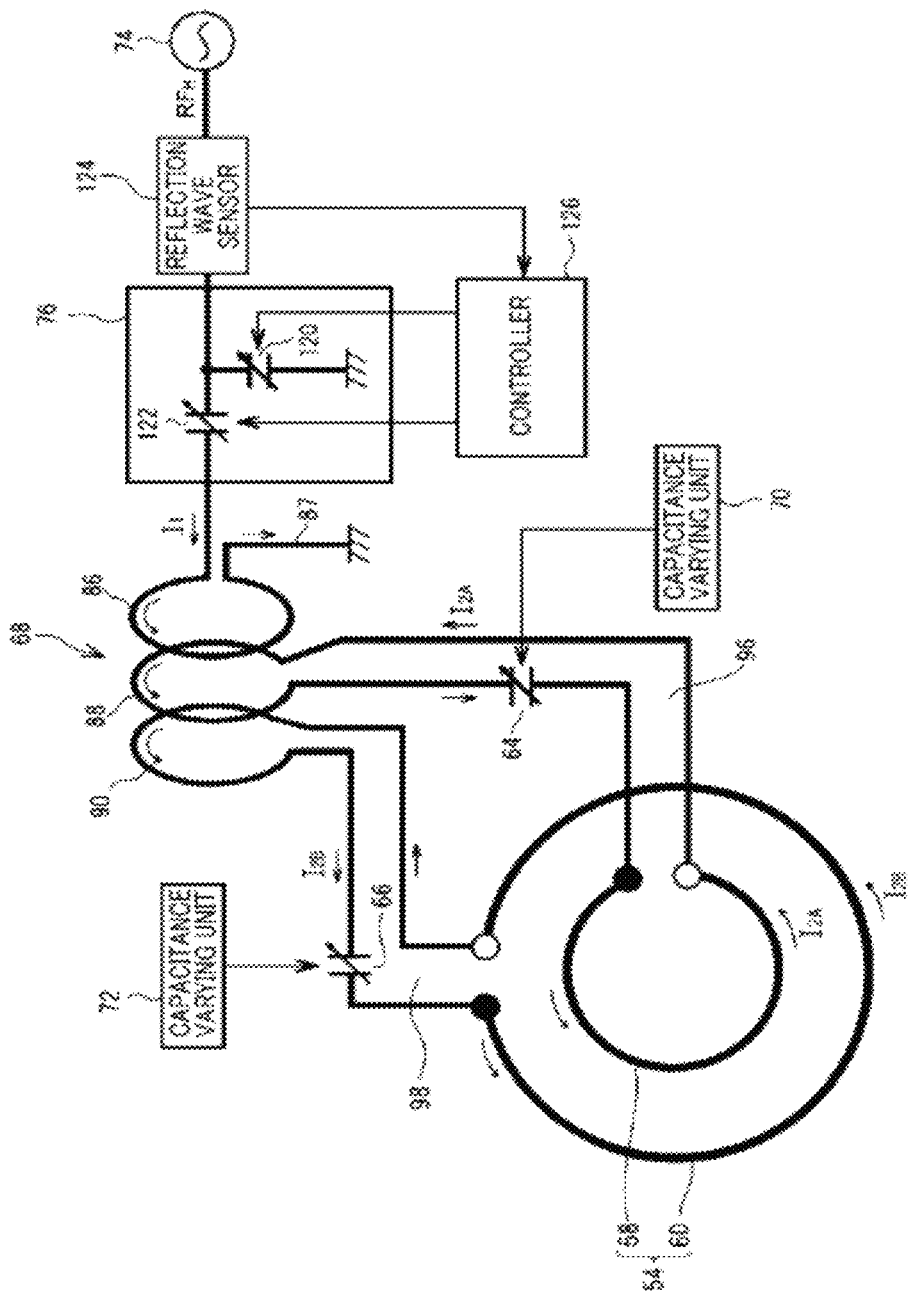
FIG. 16 shows an example of providing a typical automatic matching device in the inductively coupled plasma processing apparatus.

FIG. 16 shows an example of the inductively coupled plasma processing apparatus having a typical automatic matching device (FIG. 1). According to this example, a matching circuit within the matching unit 76 may include two variable capacitors 120 and 122 as variable reactance elements. The variable capacitors 120 and 122 maybe connected in parallel and in series with a load viewed from the high frequency power supply 74. Here, an electrostatic capacitance $C_{120}$ of the variable capacitor 120 connected in parallel with the load may mainly control an absolute value of an impedance of the load. Meanwhile, an electrostatic capacitance $C_{122}$ of the variable capacitor 122 connected in series with the load may mainly control a phase (a phase difference between a RF voltage and a RF current) of an impedance of the load.

Between the high frequency power supply 74 and the matching unit 76, a reflection wave sensor 124 configured to measure a power of a reflection wave from the plasma load may be provided. An output of the reflection wave sensor 124 may be transmitted to an automatic matching controller 126 (matching control unit). The controller 126 may be configured to vary the electrostatic capacitances (capacitance distances) $C_{120}$ and $C_{122}$ of the variable capacitors 120 and 122 through the use of a stepping motor (not shown). Therefore, the output (measurement value of a reflection wave power) of the reflection wave sensor 124 may become constantly minimum, i.e. in a matching state, even if an impedance within the secondary circuits 96 and 98 is varied by controlling the electrostatic capacitances $C_{64}$ and $C_{66}$ of the variable capacitors 64 and 66 or by varying a pressure during a plasma process.

Figure 17A:
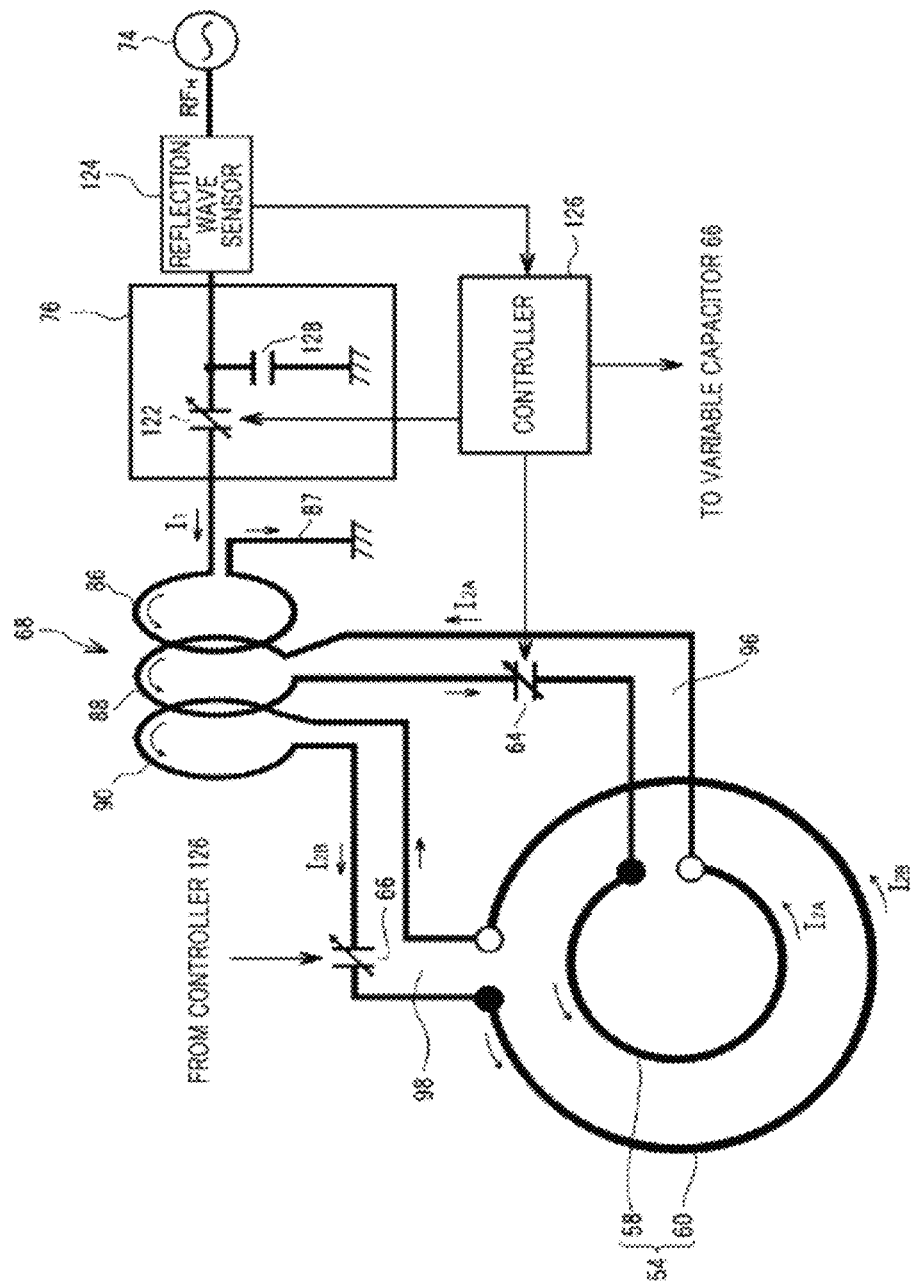
FIG. 17A shows an automatic matching device in accordance with an embodiment of the present disclosure.
Figure 17B:
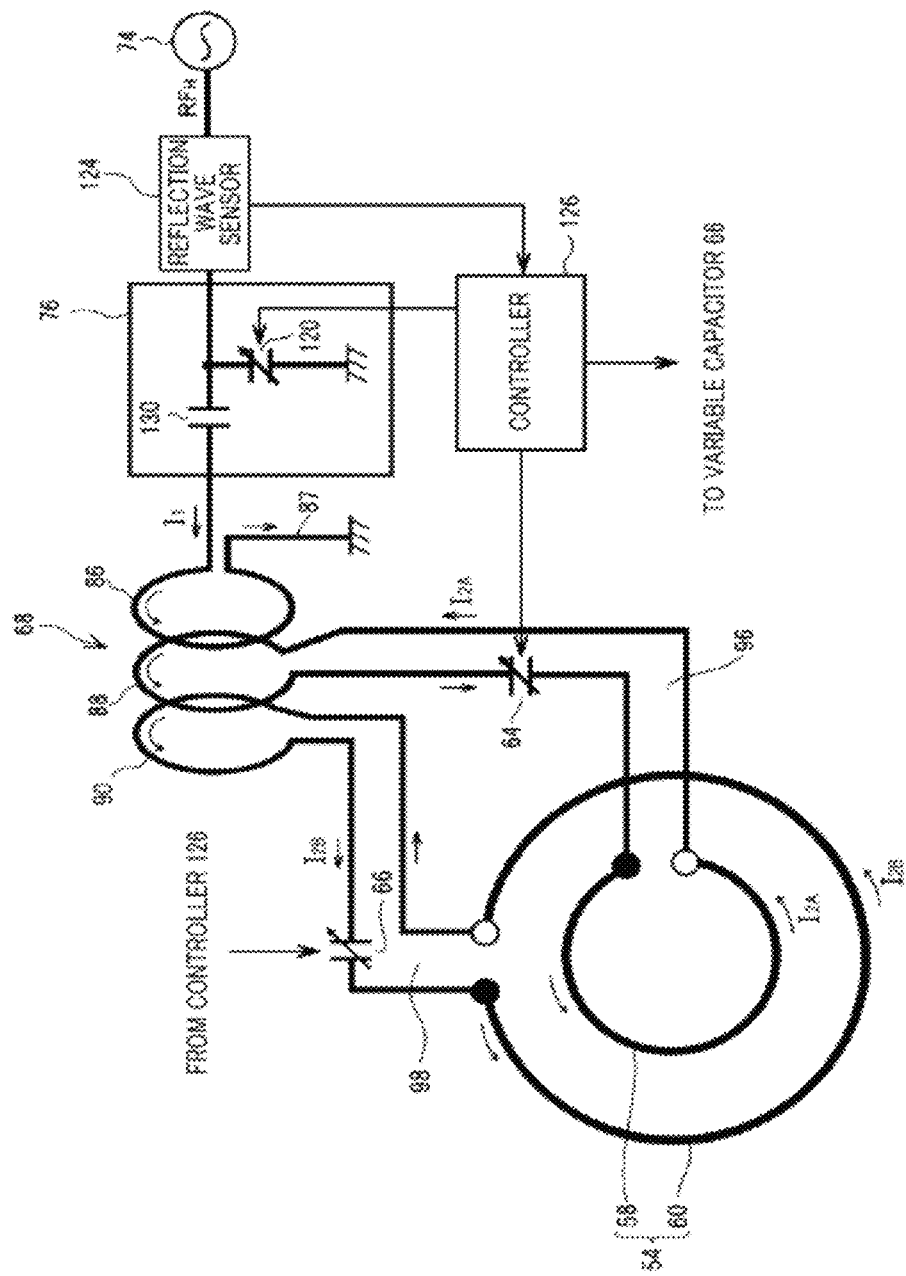
FIG. 17B shows an automatic matching device in accordance with another embodiment of the present disclosure.
Figure 17C:
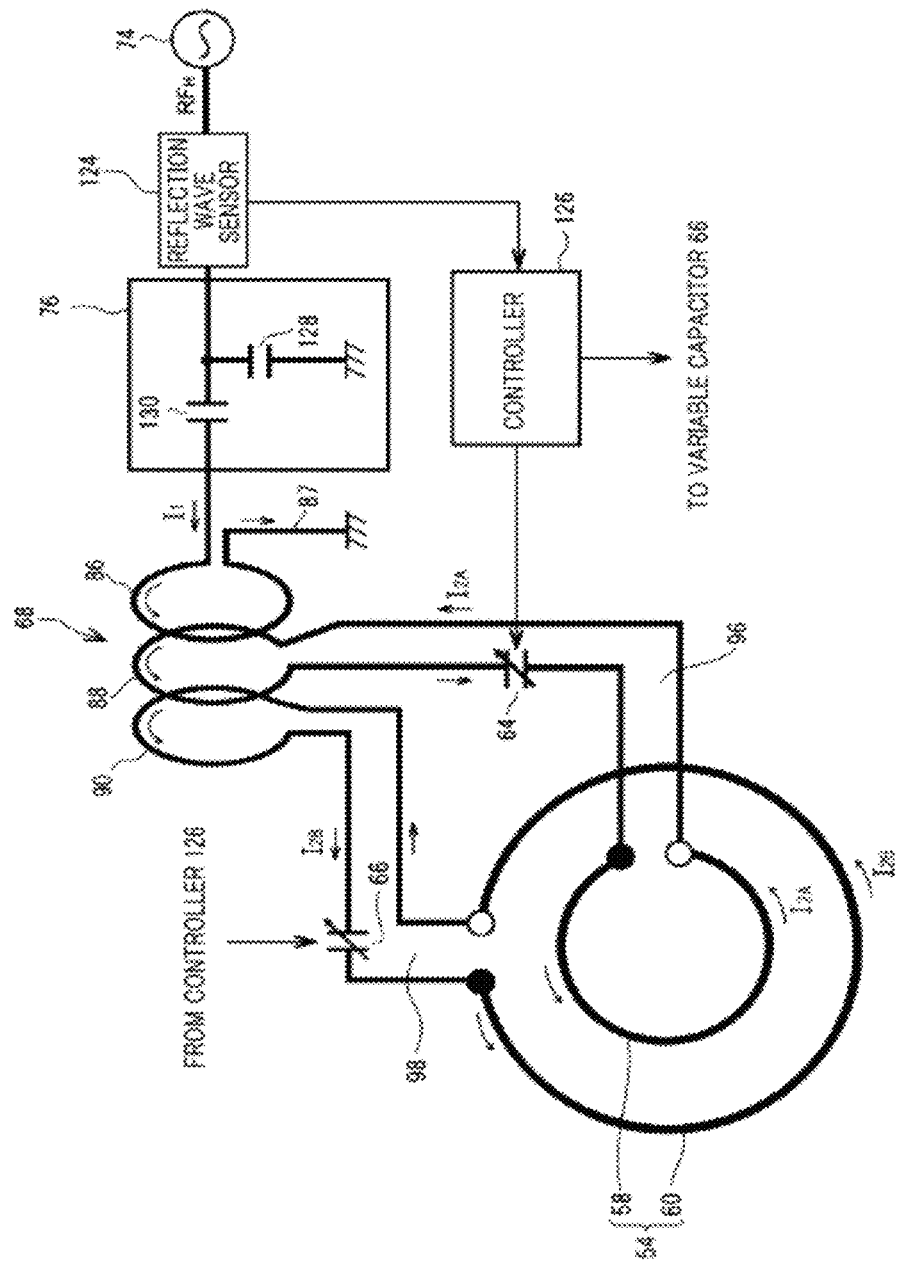
FIG. 17C shows an automatic matching device in accordance with still another embodiment of the present disclosure.

FIGS. 17A, 17B, and 17C show an automatic matching device in accordance with the experimental example of the present disclosure. In the automatic matching device in accordance with the present experimental example, the automatic matching controller 126 may share a role of the capacitance varying units 70 and 72 for controlling secondary currents or may be substituted for the capacitance varying units 70 and 72. In accordance with another aspect, the variable capacitors 64 and 66 for controlling secondary currents may have a part or all of a matching function of the matching unit 76 or may be substituted for the matching unit 76.

As described above, in the inductively coupled plasma processing apparatus (FIG. 1) of the present embodiment, the multiple antennas 58 and 60 for generating inductively coupled plasma may be electrically connected to the primary coil 86 of the high frequency power supply unit 62 via the secondary coils 88 and 90, respectively. Thus, when viewed from the primary coil 86, load resistances generated in the respective antennas 58 and 60 may be added as a load resistance of the primary coil 86. Therefore, a plasma load resistance may be determined as a great value, and automatic matching can be performed. Further, a capability or accuracy of varying reactance within the matching unit 76 can be reduced.

In this respect, in the present experimental example, the automatic matching controller 126 may share a role of the capacitance varying units 70 and 72 (FIG. 1) or may be substituted for the capacitance varying units 70 and 72.

To be specific, as depicted in FIG. 17A, the variable capacitor 120 configured to mainly control an absolute value of the load impedance may be substituted by a fixed capacitor 128. Further, the controller 126 may variably control the electrostatic capacitances $C_{64}$ and $C_{66}$ of the variable capacitors 64 and 66 within the secondary circuits 96 and 98, and the electrostatic capacitance $C_{122}$ of the variable capacitor 122 within the matching unit 76. Thus, the secondary currents $I_{2A}$ and $I_{2B}$ and the automatic matching can be controlled at the same time.

Alternatively, as depicted in FIG. 17B, the variable capacitor 122 configured to mainly control a phase of the load impedance may be substituted by a fixed capacitor 130. Further, the controller 126 may variably control the electrostatic capacitances $C_{64}$ and $C_{66}$ of the variable capacitors 64 and 66 within the secondary circuits 96 and 98, and the electrostatic capacitance $C_{120}$ of the variable capacitor 120 within the matching unit 76. Thus, the secondary currents $I_{2A}$ and $I_{2B}$ and the automatic matching can be controlled at the same time.

Further alternatively, as depicted in FIG. 17C, all variable capacitors 120 and 122 within the matching unit 76 may be substituted by the fixed capacitors 128 and 130. Further, the controller 126 may variably control the electrostatic capacitances $C_{64}$ and $C_{66}$ of the variable capacitors 64 and 66 within the secondary circuits 96 and 98. Thus, the secondary currents $I_{2A}$ and $I_{2B}$ and the automatic matching can be controlled at the same time.

Still further alternatively, instead of the reflection wave sensor 124, an impedance measurement device may be used. The controller 126 may variably control the electrostatic capacitances $C_{120}$ and $C_{122}$ of the variable capacitors 120 and 122 within the matching unit 76 and/or the electrostatic capacitances $C_{64}$ and $C_{66}$ of the variable capacitors 64 and 66. Thus, the load impedance measured by the impedance measurement device may be equivalent to or close to a matching point (50Ω).

[Another Embodiment or Modification Example]

In the inductively coupled plasma processing apparatus (FIGS. 1 and 2) of the above-described embodiment, the transformer 68 is provided within the antenna chamber 56. However, the transformer 68 may be provided outside the antenna chamber 56. Further, any arrangements or directions of the primary coils 86 and/or the secondary coils 88 and 90 can be selected.

In the inductively coupled plasma processing apparatus of the above-described embodiment, the capacitors 64 (100) and 66 (102) are provided at all the secondary circuits 96 and 98 provided between the coaxial antenna group 54 and the transformer 68. However, by way of example, each of the primary coil 86 and the secondary coils 88 and 90 of the transformer 68 may be coiled multiple times, and a tap switch may be provided to the secondary coils 88 and 90 (i.e. the secondary currents $I_{2A}$ and $I_{2B}$ are controlled by the tap switch). With this configuration, the capacitors can be omitted from at least one or all of the secondary circuits 96 and 98.

In the present disclosure, a loop shape of an antenna is not limited to a circle and may be, for example, a quadrangle or a triangle. Multiple antennas may be provided non-coaxially. A cross sectional shape of an antenna or an antenna segment may include a rectangle, a circle, and an ellipse. Further, an antenna or an antenna segment may not be limited to a single wire and can be a stranded wire.

Further, all antennas can be arranged in, for example, a dome shape other than a plane shape. Further, in a chamber having a sidewall made of a dielectric material, the antennas may be arranged in a vicinity of the sidewall.

The processing gas supply unit may be configured to supply a processing gas into the chamber 10 from a ceiling. Further, the high frequency power $RF_L$ for controlling a DC bias may not be applied to the susceptor 12.

The inductively coupled plasma processing apparatus or the inductively coupled plasma processing method of the present disclosure can be applied to, not limited to a plasma etching technology, other plasma processes such as plasma CVD, plasma oxidation, plasma nitridation, and sputtering. Further, the target substrate in the present disclosure may include, but is not limited to a semiconductor wafer, various kinds of substrates for a flat panel display or photo mask, a CD substrate, and a print substrate.

What is claimed is:

1. A plasma processing apparatus comprising:
a processing chamber including a dielectric window;
a substrate holder capable of holding a target substrate within the processing chamber;
a processing gas supply unit that supplies a processing gas into the processing chamber to perform a plasma process on the substrate;
multiple antennas provided outside the dielectric window to generate plasma of the processing gas by an induced coupling within the processing chamber;
a high frequency power supply unit that includes a high frequency power supply and a matching unit and supplies to the multiple antennas a high frequency power having a frequency for generating a high frequency electric discharge of the processing gas;
a primary coil connected to a terminal of the high frequency power supply unit;
multiple secondary coils, each being coupled with the primary coil by electromagnetic induction and electrically connected to a corresponding antenna of the multiple antennas, thereby forming closed-loop secondary circuits, mutual inductances between the primary coil and each of the multiple secondary coils being constant;
multiple variable capacitors, each being provided in each of the secondary circuits;
and a capacitance varying unit configured to vary electrostatic capacitances of the variable capacitors and control directions of currents flowing through the secondary circuits,
wherein, the electrostatic capacitances of the variable capacitors are smaller or greater than an electrostatic capacitance that allows a serial resonance to occur within the secondary circuits,
wherein the primary coil, the multiple secondary coils, and the multiple antennas have a common axis, and the multiple secondary coils are overlapped with each other when viewed from the multiple antennas, wherein the primary coil and the multiple secondary coils are located above the multiple antennas, and the multiple antennas each having a different diameter are arranged concentrically on a same plane such that the multiple secondary coils are located between the primary coil and the multiple antennas at respective different vertical heights above the multiple antennas.

2. The plasma processing apparatus of claim 1,
wherein the multiple antennas include an inner antenna and an outer antenna positioned radially with a gap therebetween.

3. The plasma processing apparatus of claim 2,
wherein the outer antenna includes multiple antenna segments that are arranged in series in an azimuth direction and each antenna segment is electrically connected to each secondary coil to form each closed-loop.

4. The plasma processing apparatus of claim 1,
wherein the multiple secondary coils are arranged at one side of the primary coil in a coil axis direction.

5. The plasma processing apparatus of claim 1,
wherein the primary coil includes first and second primary coil segments that are electrically connected in series to each other and spaced apart from each other in a coil axis direction, and
the multiple secondary coils are arranged between the first and second primary coil segments in the coil axis direction.

6. The plasma processing apparatus of claim 1,
wherein a distance between the primary coil and at least one of the secondary coils is variably controlled in a coil axis direction.

7. The plasma processing apparatus of claim 1, further comprising:
a core that is made of a material having a relative permeability greater than about 1 and interlinked with the primary coil and at least one of the secondary coils.

8. The plasma processing apparatus of claim 7,
wherein the core is relatively movable in a coil axis direction with respect to the primary coil or the secondary coils.

9. The plasma processing apparatus of claim 1, further comprising:
an endless core that is made of a material having a relative permeability greater than about 1 and interlinked with the primary coil and all of the secondary coils.

10. The plasma processing apparatus of claim 1, wherein the currents flowing through the respective secondary coils flow in a same direction as a current flowing through the primary coil along a circumference.

11. The plasma processing apparatus of claim 1, wherein the
matching unit is connected between the high frequency power supply and the primary coil.

12. The plasma processing apparatus of claim 11, wherein the high frequency power supply unit includes:
at least one variable capacitor provided within the matching unit; and
a matching control unit that varies an electrostatic capacitance of the variable capacitor within the matching unit, so as to perform matching between an impedance of the high frequency power supply source and an impedance of a load.

13. The plasma processing apparatus of claim 11, wherein
the high frequency power supply unit includes a matching control unit that varies electrostatic capacitance of the variable capacitor within the matching unit and each of electrostatic capacitances of the variable capacitors within the secondary circuits in order to perform matching between an impedance of the high frequency power supply and an impedance of a load.

14. The plasma processing apparatus of claim 11, wherein
the matching unit has a fixed capacitor, and
the high frequency power supply unit includes a matching control unit that varies each of electrostatic capacitances of the variable capacitors within the secondary circuits in order to perform matching between an impedance of the high frequency power supply and an impedance of a load.

15. A plasma processing apparatus comprising:
a processing chamber including a dielectric window;
a substrate holder capable of holding a target substrate within the processing chamber;
a processing gas supply unit that supplies a processing gas into the processing chamber to perform a plasma process on the substrate;
multiple antennas provided outside the dielectric window to generate plasma of the processing gas by an induced coupling within the processing chamber;
a high frequency power supply unit that includes a high frequency power supply and a matching unit and supplies to the multiple antennas a high frequency power having a frequency for generating a high frequency electric discharge of the processing gas;
a primary coil connected to a terminal of the high frequency power supply unit;
multiple secondary coils, each being coupled with the primary coil by electromagnetic induction and electrically connected to a corresponding antennas of the multiple antennas, thereby forming closed-loop secondary circuits, mutual inductances between the primary coil and each of the multiple secondary coils being constant;
at least one variable capacitor provided in at least one of the secondary circuits;
and a capacitance varying unit configured to vary electrostatic capacitance of the at least one variable capacitor and control current flowing through at least one secondary coil, wherein, the electrostatic capacitance of the at least one variable capacitor is smaller or greater than an electrostatic capacitance that allows a serial resonance to occur within the secondary circuit, wherein the primary coil, the multiple secondary coils, and the multiple antennas have a common axis, and the multiple secondary coils are overlapped with each other when viewed from the multiple antennas, wherein the primary coil and the multiple secondary coils are located above the multiple antennas, and the multiple antennas each having a different diameter are arranged concentrically on a same plane such that the multiple secondary coils are located between the primary coil and the multiple antennas at respective different vertical heights above the multiple antennas.

* * * * *

UNITED STATES PATENT AND TRADEMARK OFFICE
CERTIFICATE OF CORRECTION

| | | |
|---|---|---|
| PATENT NO. | : 9,218,943 B2 | Page 1 of 1 |
| APPLICATION NO. | : 13/246139 | |
| DATED | : December 22, 2015 | |
| INVENTOR(S) | : Yohei Yamazawa | |

It is certified that error appears in the above-identified patent and that said Letters Patent is hereby corrected as shown below:

In the specification,

Column 6, line 64, please add - 68 - between "transformer" and "and".

Column 10, line 32, please add - 60 - after the word "antenna".

Column 11, line 65, please add - 62 - after the word "unit".

In the claims,

Column 19, line 26, please replace the word "the" with - a -.

Signed and Sealed this
Twelfth Day of April, 2016

Michelle K. Lee
*Director of the United States Patent and Trademark Office*